US010962598B2

(12) United States Patent
Suzuki et al.

(10) Patent No.: US 10,962,598 B2
(45) Date of Patent: Mar. 30, 2021

(54) ENERGY STORAGE DEVICE STATE ESTIMATION DEVICE AND ENERGY STORAGE DEVICE STATE ESTIMATION METHOD

(71) Applicant: GS Yuasa International Ltd., Kyoto (JP)

(72) Inventors: Keita Suzuki, Kyoto (JP); Shigeki Yamate, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 132 days.

(21) Appl. No.: 16/322,249

(22) PCT Filed: Aug. 3, 2017

(86) PCT No.: PCT/JP2017/028299
§ 371 (c)(1),
(2) Date: Jan. 31, 2019

(87) PCT Pub. No.: WO2018/025965
PCT Pub. Date: Feb. 8, 2018

(65) Prior Publication Data
US 2019/0195958 A1    Jun. 27, 2019

(30) Foreign Application Priority Data

Aug. 5, 2016   (JP) .............................. JP2016-154938

(51) Int. Cl.
*G01R 31/382*     (2019.01)
*H01M 10/0585*    (2010.01)
(Continued)

(52) U.S. Cl.
CPC ........... *G01R 31/382* (2019.01); *G01R 31/36* (2013.01); *H01M 10/04* (2013.01);
(Continued)

(58) Field of Classification Search
CPC ..... G01R 31/382; G01R 31/36; H01M 10/04; H01M 10/48; H01M 10/486
See application file for complete search history.

(56) References Cited

U.S. PATENT DOCUMENTS 5,711,605 A * 1/1998 Reher ...................... G01K 7/42
374/141
2014/0195179 A1 * 7/2014 Guerin ................ H01M 10/486
702/63
(Continued)

FOREIGN PATENT DOCUMENTS

JP        2009099375 A     5/2009
JP       M 10231968 A     10/2010
(Continued)

OTHER PUBLICATIONS

International Search Report dated Aug. 29, 2017 filed in PCT/JP2017/028299.

*Primary Examiner* — Matthew J Merkling
(74) *Attorney, Agent, or Firm* — Rankin, Hill & Clark LLP

(57) ABSTRACT

Provided is an energy storage device state estimation device (100) for estimating a state of an energy storage device (200), the energy storage device state estimation device (100) including: a temperature estimation part (110) configured to estimate a temperature of the energy storage device (200); and a state estimation part (120) configured to estimate a state of the energy storage device (200) using the temperature of the energy storage device (200), wherein the temperature estimation part (110) is configured such that the energy storage device (200) is divided into a plurality of regions, the respective regions are set as internal regions, a region outside the energy storage device (200) adjacently disposed to the internal region is set as an external region, and a temperature of the energy storage device (200) is
(Continued)

estimated using an internal heat transfer amount which is a transfer amount of heat between the two internal regions disposed adjacently to each other and an external heat transfer amount which is a transfer amount of heat between the internal region and the external region disposed adjacently to each other.

15 Claims, 14 Drawing Sheets

(51) Int. Cl.
  *H01M 10/0587* (2010.01)
  *H01M 10/48* (2006.01)
  *H01M 10/04* (2006.01)
  *G01R 31/36* (2020.01)

(52) U.S. Cl.
  CPC ... *H01M 10/0585* (2013.01); *H01M 10/0587* (2013.01); *H01M 10/48* (2013.01); *H01M 10/486* (2013.01)

(56) References Cited

U.S. PATENT DOCUMENTS

| | | | |
|---|---|---|---|
| 2014/0320087 A1 | 10/2014 | Takahashi | |
| 2015/0063404 A1* | 3/2015 | Chang | B60L 58/24 |
| | | | 374/4 |
| 2015/0291055 A1* | 10/2015 | He | H01M 10/633 |
| | | | 429/50 |
| 2015/0331059 A1 | 11/2015 | Okada | |
| 2016/0380313 A1* | 12/2016 | Morita | H02J 7/0091 |
| | | | 429/50 |

FOREIGN PATENT DOCUMENTS

| | | |
|---|---|---|
| JP | 2013101884 A | 5/2013 |
| JP | 2013118724 A | 6/2013 |
| JP | 2013247023 A | 12/2013 |
| JP | 2014026913 A | 2/2014 |
| JP | 2015077028 A | 4/2015 |
| JP | 2015138733 A | 7/2015 |
| WO | 2014118911 A1 | 8/2014 |
| WO | 2016038658 A1 | 3/2016 |

* cited by examiner

Fig. 4

| Charge-discharge point of time | Measured voltage | Open circuit voltage | Current | SOC | Outside air temperature |
|---|---|---|---|---|---|
| t1 | $V_{exp}1$ | $V_{ocv}1$ | I1 | S1 | $T_{Re}1$ |
| t2 | $V_{exp}2$ | $V_{ocv}2$ | I2 | S2 | $T_{Re}2$ |
| t3 | $V_{exp}3$ | $V_{ocv}3$ | I3 | S3 | $T_{Re}3$ |
| t4 | $V_{exp}4$ | $V_{ocv}4$ | I4 | S4 | $T_{Re}4$ |
| t5 | $V_{exp}5$ | $V_{ocv}5$ | I5 | S5 | $T_{Re}5$ |
| ⋮ | ⋮ | ⋮ | ⋮ | ⋮ | ⋮ |

| Internal region | Neighboring region | Heat transfer coefficient | Heat value | Temperature | | |
|---|---|---|---|---|---|---|
| | | | | Point of time t1 | Point of time t2 | ... |
| R1 | R2 | h12 | $C_{R1}$ | $T_{R1}1$ | $T_{R1}2$ | ... |
| | R3 | h13 | | | | |
| | R5 | h15 | | | | |
| | ⋮ | ⋮ | | | | |
| ⋮ | ⋮ | ⋮ | ⋮ | ⋮ | ⋮ | ⋮ |
| R7 | Re (External region) | h7e | $C_{R7}$ | $T_{R7}1$ | $T_{R7}2$ | ... |
| | ⋮ | ⋮ | | | | |
| ⋮ | ⋮ | ⋮ | ⋮ | ⋮ | ⋮ | ⋮ |

ENERGY STORAGE DEVICE STATE ESTIMATION DEVICE AND ENERGY STORAGE DEVICE STATE ESTIMATION METHOD

TECHNICAL FIELD

The present invention relates to an energy storage device state estimation device and an energy storage device state estimation method for estimating a state of an energy storage device.

BACKGROUND ART

An energy storage device such as a lithium ion secondary battery has been used as a power source of a mobile device such as a notebook computer or a mobile phone. However, recently, an energy storage device has been used in various field including a power source of an electric vehicle.

Conventionally, with respect to such an energy storage device, a technique has been proposed where a state of an energy storage device is estimated based on a measurement result obtained by measuring a temperature (see patent document 1, for example). In this technique, there has been proposed a control where a temperature of at least one cell block is measured, and temperatures are estimated with respect to cell blocks whose temperatures are not yet measured, and when abnormality in temperature such as an abnormally high temperature or an abnormally low temperature is detected, charging or discharging of the energy storage device is stopped.

PRIOR ART DOCUMENT

Patent Document

Patent Document 1: JP-A-2009-99375

SUMMARY OF THE INVENTION

Problems to be Solved by the Invention

However, the above-mentioned prior art has a drawback that it is necessary to measure a temperature of the energy storage device (a cell block in patent document 1). That is, the energy storage device requires a temperature sensor such as a thermocouple for measuring the temperature thus giving rise to a drawback that the configuration of the energy storage device becomes complicated.

The present invention has been made to overcome the above-mentioned drawbacks, and it is an object of the present invention to provide an energy storage device state estimation device and an energy storage device state estimation method which can estimate a state of an energy storage device with a simple configuration.

Means for Solving the Problems

To achieve the above-mentioned object, an energy storage device state estimation device according to an aspect of the present invention is an energy storage device state estimation device for estimating a state of an energy storage device, the energy storage device state estimation device including: a temperature estimation part configured to estimate a temperature of the energy storage device; and a state estimation part configured to estimate a state of the energy storage device using the temperature of the energy storage device, wherein the temperature estimation part is configured such that the energy storage device is divided into a plurality of regions, the respective regions are set as internal regions, a region outside the energy storage device adjacently disposed to the internal regions is set as an external region, and a temperature of the energy storage device is estimated using an internal heat transfer amount which is a transfer amount of heat between the two internal regions disposed adjacently to each other and an external heat transfer amount which is a transfer amount of heat between the internal region and the external region disposed adjacently to each other.

The present invention can be realized not only in the form of such an energy storage device state estimation device but also in the form of an energy storage system which includes an energy storage device and an energy storage device state estimation device which estimates a state of the energy storage device.

The present invention can be also realized in the form of an energy storage device state estimation method which uses characteristic processing which an energy storage device state estimation device performs as a step of the method. The present invention can be also realized in the form of an integrated circuit which includes a characteristic processing part included in an energy storage device state estimation device. The present invention can be also realized in the form of a program which allows a computer to execute characteristic processing contained in an energy storage device state estimation method or in the form of a storage medium such as a computer readable Compact Disc-Read Only Memory (CD-ROM) in which the program is stored. Such a program can be circulated through a transmission medium such as a storage medium such as a CD-ROM, the Internet or the like.

Advantages of the Invention

According to the energy storage device state estimation device of the present invention, a state of an energy storage device can be estimated with a simple configuration.

BRIEF DESCRIPTION OF THE DRAWINGS

FIG. 4 is a view showing one example of charge-discharge history data stored in a memory according to the embodiment.

FIG. 5 is a view showing one example of estimation data stored in the memory according to the embodiment.

MODE FOR CARRYING OUT THE INVENTION

Figure 1:
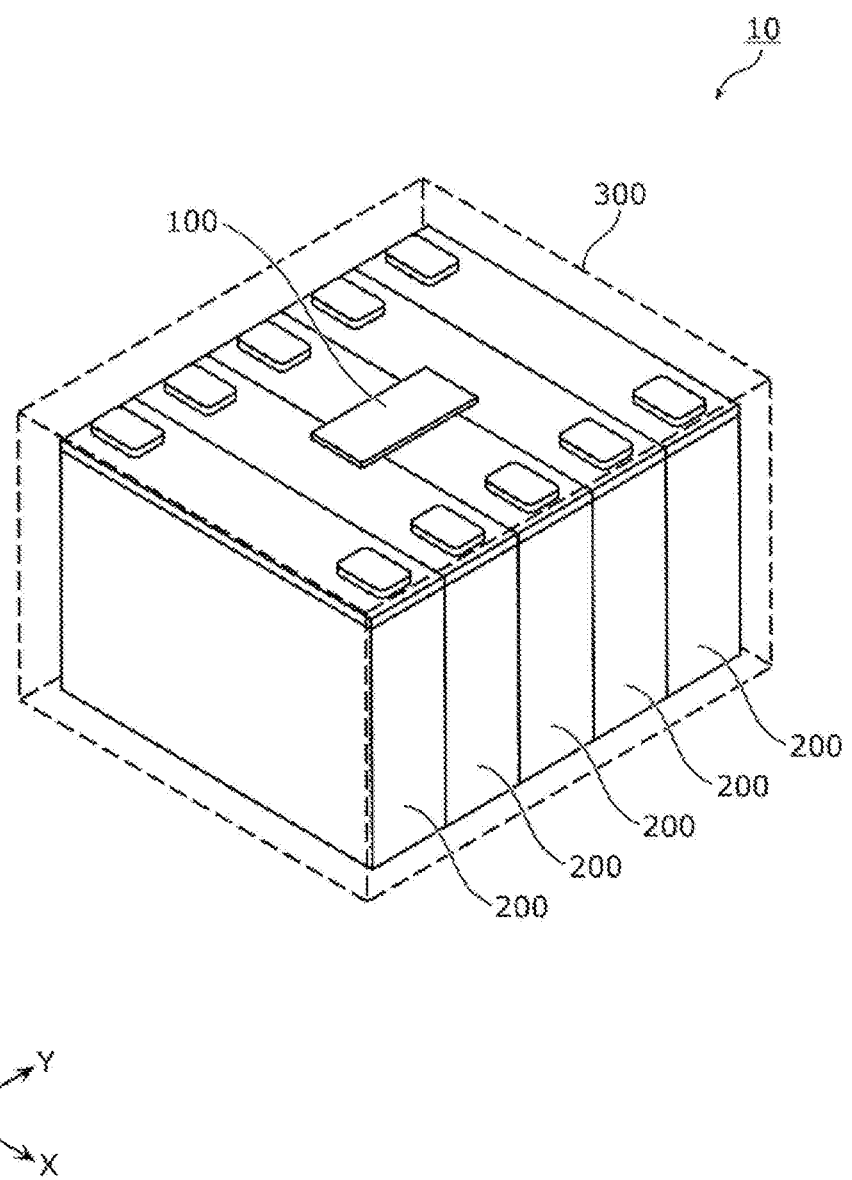
FIG. 1 is an external appearance view of an energy storage system which includes an energy storage device state estimation device according to an embodiment.

To achieve the above-mentioned object, an energy storage device state estimation device according to one mode of the present invention is an energy storage device state estimation device for estimating a state of an energy storage device which includes: a temperature estimation part configured to estimate a temperature of the energy storage device; and a state estimation part configured to estimate a state of the energy storage device using the temperature of the energy storage device, wherein the temperature estimation part is configured such that the energy storage device is divided into a plurality of regions, the respective regions are set as internal regions, a regions outside the energy storage device adjacently disposed to the internal regions is set as an external region, and a temperature of the energy storage device is estimated using an internal heat transfer amount which is a transfer amount of heat between the two internal regions disposed adjacently to each other and an external heat transfer amount which is a transfer amount of heat between the internal region and the external region disposed adjacently to each other.

In such a configuration, the energy storage device state estimation device estimates a temperature of the energy storage device using an internal heat transfer amount which is a transfer amount of heat between the two internal regions disposed adjacently to each other and an external heat transfer amount which is a transfer amount of heat between the internal region and the external region disposed adjacently to each other, and estimates a state of the energy storage device using the temperature. In this manner, according to the energy storage device state estimation device, a temperature of the energy storage device can be estimated using an internal heat transfer amount and an external heat transfer amount and hence, the number of temperature sensors for measuring the temperature of the energy storage device can be reduced or it is unnecessary to use temperature sensors. Accordingly, it is possible to estimate a state of the energy storage device by estimating a temperature of the energy storage device using the simple configuration.

The energy storage device state estimation device may further include a memory configured to store respective heat transfer coefficients each of which is a heat transfer coefficient between the two internal regions disposed adjacently to each other, and respective heat transfer coefficients each of which is a heat transfer coefficient between the internal region and the external region disposed adjacently to each other, and the temperature estimation part may be configured to calculate the internal heat transfer amount and the external heat transfer amount using the heat transfer coefficients stored in the memory.

With such a configuration, the energy storage device state estimation device stores a heat transfer coefficient between two internal regions and a heat transfer coefficient between the internal region and the external region in the memory, and calculates the internal heat transfer amount and the external heat transfer amount using the heat transfer coefficients stored in the memory. That is, there is a possibility that the heat transfer coefficient differs depending on the respective regions and hence, the heat transfer coefficients of the respective regions are stored in the memory, and these heat transfer coefficients are used in the calculation. Accordingly, the energy storage device state estimation device can estimate a state of the energy storage device by calculating an internal heat transfer amount and an external heat transfer amount with high accuracy with the simple configuration.

The energy storage device may have an electrode assembly formed by stacking plates, and in the memory, a first heat transfer coefficient which is a heat transfer coefficient between the two internal regions arranged in a stacking direction of the plates, and a second heat transfer coefficient which is a heat transfer coefficient between the two internal regions disposed in a direction which intersects with the stacking direction and is larger than the first heat transfer coefficient are stored.

With such a configuration, in the energy storage device state estimation device, a first heat transfer coefficient which is a heat transfer coefficient in a stacking direction of the plates of the electrode assembly, and a second heat transfer coefficient which is a heat transfer coefficient in a direction which intersects with the stacking direction and is larger than the first heat transfer coefficient are stored in the memory. That is, the heat transfer coefficient in a planar direction of the plates becomes larger than the heat transfer coefficient in a stacking direction. According to the energy storage device state estimation device, it is possible to estimate a state of the energy storage device by estimating a temperature of the energy storage device with high accuracy by storing the accurate heat transfer coefficients in the memory.

The energy storage device may include a plurality of the electrode assemblies, and a third heat transfer coefficient which is the first heat transfer coefficient in the inside of the same electrode assembly and a fourth heat transfer coefficient which is the first heat transfer coefficient between the different electrode assemblies and is smaller than the third heat transfer coefficient may be stored in the memory.

With such a configuration, the energy storage device state estimation device stores a third heat transfer coefficient which is the first heat transfer coefficient in the inside of the same electrode assembly and a fourth heat transfer coefficient which is the first heat transfer coefficient between the different electrode assemblies and is smaller than the third heat transfer coefficient are stored in the memory. That is, in general, an outer periphery of the electrode assembly is covered by a separator, an insulation sheet or the like, the heat transfer coefficient between the electrode assemblies becomes smaller than the heat transfer coefficient in the inside of the electrode assembly. According to the energy storage device state estimation device, it is possible to estimate a state of the energy storage device by estimating a temperature of the energy storage device with higher accuracy by storing the accurate heat transfer coefficients in the memory.

Each of the plurality of electrode assemblies may have a flat portion and bent portions formed by winding the plates, and in the memory, a fifth heat transfer coefficient which is the fourth heat transfer coefficient in the flat portion and a sixth heat transfer coefficient which is the fourth heat transfer coefficient in the bent portions and is smaller than the fifth heat transfer coefficient may be stored.

With such a configuration, the energy storage device state estimation device stores a fifth heat transfer coefficient which is the fourth heat transfer coefficient in the flat portion of the winding-type electrode assembly and a sixth heat transfer coefficient which is the fourth heat transfer coefficient in the bent portions of the electrode assembly and is smaller than the fifth heat transfer coefficient in the memory. That is, when a plurality of winding-type electrode assemblies are arranged parallel to each other, a distance between the bent portions of the electrode assemblies disposed adjacently to each other becomes larger than a distance between the flat portions of the electrode assemblies disposed adjacently to each other and hence, a heat transfer coefficient between the bent portions of the electrode assemblies of the electrode assemblies disposed adjacently to each other becomes smaller than a heat transfer coefficient between the flat portions of the electrode assemblies of the electrode assemblies disposed adjacently to each other. According to the energy storage device state estimation device, it is possible to estimate a state of the energy storage device by estimating a temperature of the energy storage device with higher accuracy by storing the accurate heat transfer coefficients in the memory.

The temperature estimation part may calculate the internal heat transfer amount and the external heat transfer amount from the first point of time to the second point of time using a temperature of the internal region and a temperature of the external region at the first point of time, may calculate a temperature of the internal region at the second point of time using the calculated internal heat transfer amount and the calculated external heat amount, and may estimate a temperature of the energy storage device using the calculated temperature of the internal region.

With such a configuration, the energy storage device state estimation device calculates a temperature of the internal region at the second point of time which comes after the first point of time using a temperature of the internal region and a temperature of the external region at the first point of time, and estimates a temperature of the energy storage device. That is, the energy storage device state estimation device updates the temperature of the internal region by using the temperature of the internal region and the temperature of the external region in the past. Accordingly, the energy storage device state estimation device can estimate a state of the energy storage device by accurately estimating the temperature of the energy storage device.

The temperature estimation part may acquire a temperature in a space where the energy storage device is disposed as a temperature of the external region.

With such a configuration, the energy storage device state estimation device can use the temperature in a space where the energy storage device is disposed (outside air temperature) as a temperature of the external region. Accordingly, the energy storage device state estimation device can estimate a state of the energy storage device by easily estimating a temperature of the energy storage device.

With respect to a temperature of the internal region acquired using the internal heat transfer amount and the external heat transfer amount, the temperature estimation part may calculate a temperature of the internal region at a center position of the energy storage device or an average value of temperatures of the respective internal regions as a temperature of the energy storage device.

With such a configuration, by calculating a temperature of the internal region at a center position of the energy storage device or an average value of temperatures of the respective internal regions as a temperature of the energy storage device, the energy storage device state estimation device can estimate a state of the energy storage device by estimating a temperature of the energy storage device with high accuracy.

Further, to achieve the above-mentioned object, an energy storage device state estimation device according to an aspect of the present invention may be an energy storage device state estimation device for estimating a state of an energy storage device which includes: a temperature estimation part configured to estimate a temperature of the energy storage device; and a state estimation part configured to estimate a state of the energy storage device using the temperature of the energy storage device, wherein a temperature of the energy storage device is estimated using a heat generation amount calculated based on a difference between a measured voltage and an open circuit voltage and a current value of the energy storage device and a current value within a predetermined period, and a heat absorption amount and a heat generation amount acquired based on a change in an SOC (State Of Charge) within the predetermined period.

With such a configuration, the energy storage device state estimation device can estimate a temperature of the energy storage device using a measured voltage, an open circuit voltage, a current value and a heat absorption or generation amount of the energy storage device and hence, the number of temperature sensors for measuring a temperature of the energy storage device can be reduced or it is unnecessary to use temperature sensors. Accordingly, it is possible to estimate a state of the energy storage device by estimating a temperature of the energy storage device using the simple configuration.

Hereinafter, an energy storage device state estimation device and an energy storage system which includes the energy storage device state estimation device according to an embodiment of the present invention are described with reference to drawings. All embodiments described hereinafter are preferred and specific examples of the present invention. In the embodiments described hereinafter, numerical values, shapes, materials, constitutional elements, the arrangement positions and connection states of the constitutional elements, manufacturing steps, the order of manufacturing steps and the like are merely examples, and these are not intended to be used for limiting the present invention. Further, out of the constitutional elements in the embodiment described hereinafter, the constitutional elements which are not described in independent claims describing an uppermost concept are described as arbitrary constitutional elements.

In the description made hereinafter and drawings, an arrangement direction of current collectors or electrode terminals, a winding axis direction of an electrode assembly of an energy storage device, or an opposedly facing direction of short side surfaces of a case is defined as an X axis direction. An arrangement direction of a plurality of energy storage devices, an arrangement direction of a plurality of electrode assemblies, a stacking direction of plates of the electrode assembly, an arrangement direction of legs of the current collector, an opposedly facing direction of long side surfaces of the case, a lateral direction of the short side surface of the case, or a thickness direction of the case is defined as a Y axis direction. Further, a vertical direction of the energy storage device (a direction along which the gravity acts on the energy storage device in a state where the energy storage device is installed such that a lid body is directed upward), a direction along which the leg of the current collector extends, or a longitudinal direction of the short side surface of the case is defined as a Z axis direction. These X axis direction, Y axis direction, and Z axis direction are directions intersecting with each other (orthogonal to each other in this embodiment). There may be also a case where the Z axis direction does not agree with the vertical direction depending on a use state of the energy storage device and hence, the Z axis direction is not limited to the vertical direction. However, in the description made hereinafter, for the sake of convenience of explanation, the description is made by assuming that the Z axis direction agrees with the vertical direction. Further, in the description made hereinafter, a plus side in the X axis direction indicates an arrow direction side of an X axis, and a minus side in the X axis direction indicates a side opposite to the plus side in the X axis direction. The same goes also for the Y axis direction and the Z axis direction.

Embodiment

First, the configuration of the energy storage system 10 is described. FIG. 1 is an external appearance view of an energy storage system 10 which includes an energy storage device state estimation device 100 according to an embodiment of the present invention.

As shown in FIG. 1, the energy storage system 10 is an energy storage module which includes the energy storage device state estimation device 100, a plurality of (five in FIG. 1) energy storage devices 200, and an accommodating case 300 which accommodates the energy storage device state estimation device 100 and the plurality of energy storage devices 200. That is, one energy storage device state estimation device 100 is provided per five energy storage devices 200.

The energy storage device state estimation device 100 is a flat-plate like printed circuit board which is disposed above the plurality of energy storage devices 200. A circuit for estimating a state of the energy storage device 200 at a predetermined point of time is mounted on the energy storage device state estimation device 100. To be more specific, the energy storage device state estimation device 100 is connected to all energy storage devices 200, and estimates a state of each energy storage device 200 such as a degradation state of the energy storage device 200 at a predetermined point of time by acquiring information from each energy storage device 200.

In this embodiment, the energy storage device state estimation device 100 is disposed above the energy storage devices 200. However, the energy storage device state estimation device 100 may be disposed at any desired position. The shape of the energy storage device state estimation device 100 is also not particularly limited.

The number of energy storage device state estimation device 100 is not limited to one, and a plurality of energy storage device state estimation devices 100 may be provided. For example, one energy storage device state estimation device 100 may be provided per two or three energy storage devices 200. The energy storage device state estimation devices 100 may be provided such that each energy storage device state estimation device 100 corresponds to each energy storage device 200. A plurality of energy storage device state estimation devices 100 may be provided to one energy storage device 200. That is, a desired number of energy storage device state estimation devices 100 may be connected to a desired number of energy storage devices 200. The detailed functional configuration of the energy storage device state estimation device 100 is described later.

The energy storage device 200 is a secondary battery which can charge electricity or discharge electricity. To be more specific, the energy storage device 200 is a nonaqueous electrolyte secondary battery such as a lithium ion secondary battery. For example, the energy storage device 200 is applicable to a power source for an automobile such as an electric vehicle (EV), a hybrid electric vehicle (HEV), a plug-in hybrid electric vehicle (PHEV) or the like, a power source for electronic equipment, a power source for power storage application or the like. In FIG. 1, five rectangular-shaped energy storage devices 200 are arranged in series thus forming an assembled battery.

The number of energy storage devices 200 is not limited to five. The number of energy storage devices 200 may be any other plural number, or one. A plural number of energy storage devices 200 may be connected to each other in parallel. The energy storage device 200 is not limited to a nonaqueous electrolyte secondary battery, and may be a secondary battery other than a nonaqueous electrolyte secondary battery, or may be a capacitor.

Figure 2:
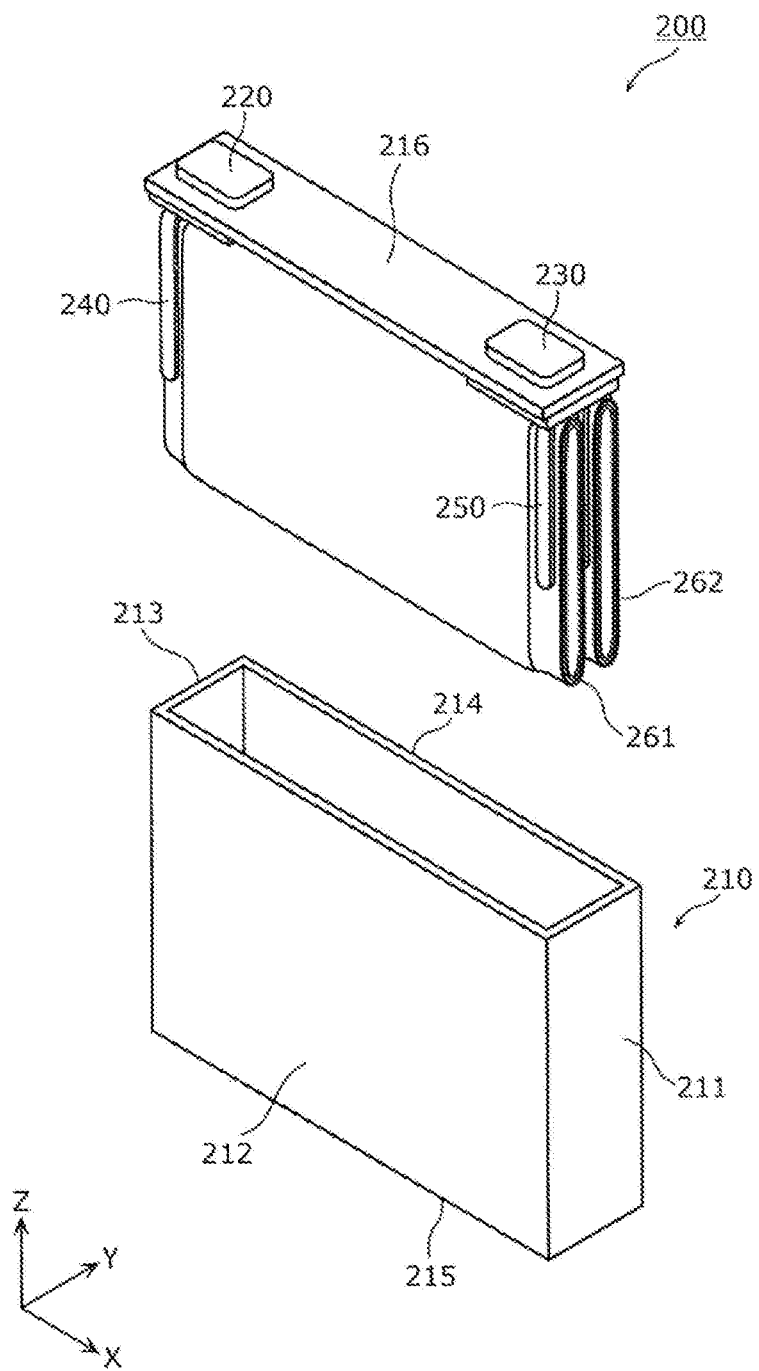
FIG. 2 is a perspective view showing constitutional elements disposed in the inside of a case of an energy storage device according to the embodiment.

The configuration of the energy storage device 200 is described in detail hereinafter. FIG. 2 is a perspective view showing constitutional elements disposed in the inside of the case 210 of the energy storage device 200 according to this embodiment. To be more specific, FIG. 2 is a perspective view showing the configuration of the energy storage device 200 in a state where a body portion of the case 210 is removed from the energy storage device 200.

As shown in FIG. 2, the energy storage device 200 includes the case 210, a positive electrode terminal 220, and a negative electrode terminal 230. A positive electrode current collector 240, a negative electrode current collector 250, and two electrode assemblies 261, 262 are accommodated in the case 210.

Besides the above-mentioned constitutional elements, spacers disposed in the case 210, gaskets disposed around the terminals, a gas release valve for releasing a pressure when a pressure in the case 210 is increased, an insulation film which wraps the electrode assemblies 261, 262 and the like may be disposed in the energy storage device 200. An electrolyte solution (non-aqueous electrolyte) is sealed in the case 210. However, the illustration of the electrolyte solution is omitted. A kind of the electrolyte solution is not particularly limited, and any kind of electrolyte solution can be selected provided that the performance of the energy storage device 200 is not impaired.

The case 210 is a box-type member having plate-like side walls 211 to 214 and a plate-like bottom wall 215 which form a case body, and a plate-like lid body 216 which closes an opening of the case body. A material for forming the case 210 is not particularly limited. For example, weldable metal such as stainless steel, aluminum or an aluminum alloy can be used as the material for forming the case 210. A resin can be also used as the material for forming the case 210.

The electrode assemblies 261, 262 are two energy storage elements (power generating elements) which can store electricity respectively, and respectively include a positive electrode plate, a negative electrode plate and separators. That is, two electrode assemblies consisting of the electrode assembly 261 and the electrode assembly 262 are arranged in parallel in the Y axis direction.

In this embodiment, the positive electrode plate which the electrode assemblies 261, 262 respectively include is a plate where a positive active material layer is formed on a positive electrode substrate layer which is a current collecting foil having an elongated strip shape and made of aluminum, an aluminum alloy or the like. The negative electrode plate is a plate where a negative active material layer is formed on a negative electrode substrate layer which is a current collecting foil having an elongated strip shape and made of copper, a copper alloy or the like. As the separator, a microporous sheet made of a resin or a non-woven fabric can be used. As a material for forming the above-mentioned current collecting foil, a known material such as nickel, iron, stainless steel, titan, calcinated carbon, conductive polymer, conductive glass, an Al—Cd alloy or the like can be also suitably used.

The electrode assemblies 261, 262 are respectively formed by stacking the plates. That is, the electrode assemblies 261, 262 are respectively formed by winding the positive electrode plate, the negative electrode plate and the separators in a state where the positive electrode plate, the negative electrode plate, and the separators are disposed in a layered manner such that the separator is disposed between the positive electrode plate and the negative electrode plate. To be more specific, the electrode assemblies 261, 262 are formed by winding the positive electrode plate and the negative electrode plate with the separator sandwiched between the positive electrode plate and the negative electrode plate in a state where the positive electrode plate and the negative electrode plate are displaced from each other in a winding axis (an imaginary axis parallel to the X axis direction in this embodiment) direction. On outermost peripheries of the respective electrode assemblies 261, 262, only the separator is wound by one turn or two turns in a state where only the separators are made to overlap with each other in double interposing neither the positive electrode plate nor the negative electrode plate between the separators thus ensuring insulation property. The separators on the outermost peripheries of the electrode assemblies 261, 262 may be wound by any number of turns. In this embodiment, although an elongated circular shape is shown as a cross-sectional shape of the electrode assemblies 261, 262, an elliptical shape may be adopted as the cross-sectional shape of the electrode assemblies 261, 262.

As the positive active material used for forming the positive active material layer, a known material can be suitably used provided that the positive active material can occlude and discharge lithium ions. As the positive active material, for example, a polyanion compound such as $LiMPO_4$, $LiMSiO_4$, $LiMBO_3$ (M being one kind or two or more kinds of transition metal elements selected from a group consisting of Fe, Ni, Mn, Co and the like), lithium titanate, a spinel-type lithium manganate such as $LiMn_2O_4$, $LiMn_{1.5}Ni_{0.5}O_4$, lithium transition metal oxide such as $LiMO_2$ (M being one kind or two or more kinds of transition metal elements selected from a group consisting of Fe, Ni, Mn, Co and the like) or the like can be used.

As the negative active material used for forming the negative active material layer, a known material can be suitably used provided that the negative active material can occlude and discharge lithium ions. As the negative active material, for example, besides lithium metal and a lithium alloy (lithium-silicon, lithium-aluminum, lithium-lead, lithium-tin, lithium-aluminum-tin, lithium-gallium, and a lithium metal containing alloy such as a wood alloy), an alloy which can occlude or discharge lithium ions, a carbon material (for example, graphite, hardly graphitizable carbon, easily graphitizable carbon, low-temperature sintered carbon, amorphous carbon or the like), silicon oxide, metal oxide, lithium metal oxide ($Li_4Ti_5O_{12}$ or the like), a polyphosphoric acid compound, or a compound of transition metal and an elements belonging to any one of groups 14 to 16 such as $Co_3O_4$, $Fe_2P$ or the like which is generally referred to as a conversion negative electrode and the like can be named.

The positive electrode terminal 220 is an electrode terminal electrically connected to the positive electrode plates of the electrode assemblies 261, 262, and the negative electrode terminal 230 is an electrode terminal electrically connected to the negative electrode plates of the electrode assemblies 261, 262. The positive electrode terminal 220 and the negative electrode terminal 230 are mounted on the lid body 216. Although materials for forming the positive electrode terminal 220 and the negative electrode terminal 230 are not particularly limited, for example, the positive electrode terminal 220 and the negative electrode terminal 230 are made of aluminum, an aluminum alloy or the like.

The positive electrode current collector 240 is a member having conductivity and rigidity which is electrically connected (bonded) to the positive electrode terminal 220 and the positive electrode plate of the electrode assembly 261, 262. The negative electrode current collector 250 is a member having conductivity and rigidity which is electrically connected (bonded) to the negative electrode terminal 230 and the negative electrode plate of the electrode assembly 261, 262. The positive electrode current collector 240 and the negative electrode current collector 250 are fixed to the lid body 216. Although materials for forming the positive electrode current collector 240 and the negative electrode current collector 250 are not particularly limited, for example, the positive electrode current collector 240 is made of aluminum, an aluminum alloy or the like in the same manner as the above-mentioned positive electrode substrate layer, and the negative electrode current collector 250 is made of copper, a copper alloy or the like in the same manner as the above-mentioned negative electrode substrate layer.

Figure 3:
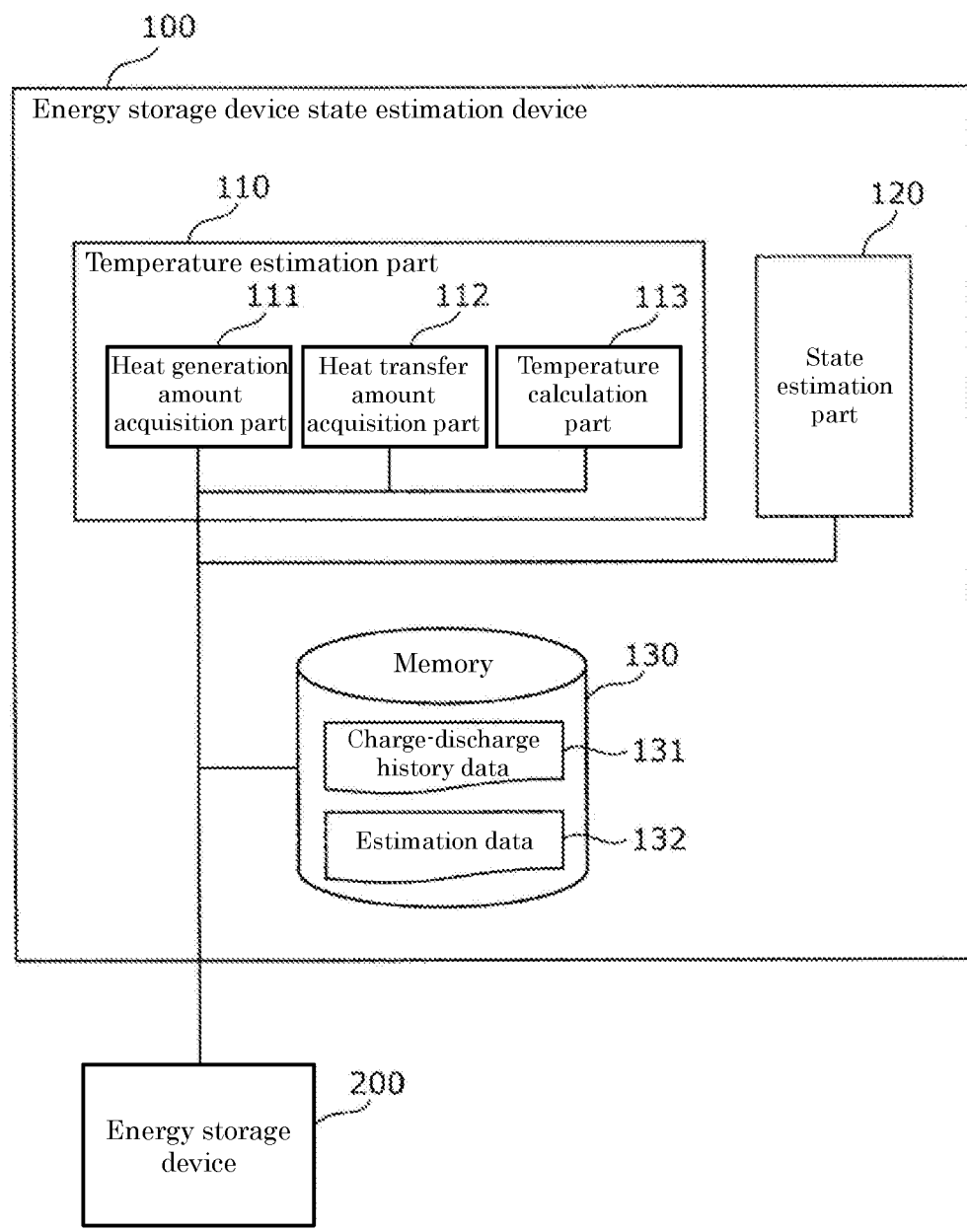
FIG. 3 is a block diagram showing a functional configuration of the energy storage device state estimation device according to the embodiment.

Next, the detailed functions and configuration of the energy storage device state estimation device 100 are described. FIG. 3 is a block diagram showing the functional configuration of the energy storage device state estimation device 100 according to this embodiment.

The energy storage device state estimation device 100 is a device for estimating a state of the energy storage device 200. In this embodiment, a state of the energy storage device 200 means an electrical or mechanical state of the energy storage device 200 and includes, for example, a degradation state indicative of a degree of degradation of performance of the energy storage device 200 and abnormal state indicative of the occurrence of an abnormal behavior of the energy storage device 200.

As shown in FIG. 3, the energy storage device state estimation device 100 includes a temperature estimation part 110, a state estimation part 120 and a memory 130. The temperature estimation part 110 also includes: a heat generation amount acquisition part 111; a heat transfer amount acquisition part 112; and a temperature calculation part 113. The memory 130 is a memory for storing respective data for estimating a state of the energy storage device 200, and charge-discharge history data 131 and estimation data 132 are stored.

Firstly, charge-discharge history data 131 and estimation data 132 stored in the memory 130 are described. FIG. 4 is an example of charge-discharge history data 131 stored in the memory 130 according to this embodiment. FIG. 5 is an example of estimation data 132 stored in the memory 130 according to this embodiment.

As shown in FIG. 4, data indicative of charge-discharge history which is operation history of the energy storage device 200 until a predetermined point of time is written in charge-discharge history data 131. That is, in charge-discharge history data 131, a data table is written where "charge-discharge point of time", "measured voltage", "open circuit voltage", "current", "SOC" and "outside air temperature" are associated with each other.

In this embodiment, in "charge-discharge point of time", date (year, month, day) and time which are information indicative of a point of time measured by a timer or the like at which the energy storage device 200 is charged or discharged are stored. As a unit of the charge-discharge point of time, any unit such as year, month, day, hour, minute, second or the number of cycles (the number of charge-discharge times) can be used. In "measured voltage", "current" and "SOC", information indicative of a voltage, a current and an SOC (State Of Charge) of the energy storage device 200 at the charge-discharge point of time is stored. In "open circuit voltage", information indicative of an estimated value of an open circuit voltage of the energy storage device 200 at the charge-discharge point of time is stored. In "outside air temperature", information indicative of outside air temperature of the energy storage device 200 at the charge-discharge point of time, that is, a temperature of a space where the energy storage device 200 is disposed is stored.

As shown in FIG. 5, in estimation data 132, a data table where "internal region" "adjacently disposed region", "heat transfer coefficient", "heat value" and "temperature" are associated with each other is written.

Figure 6:
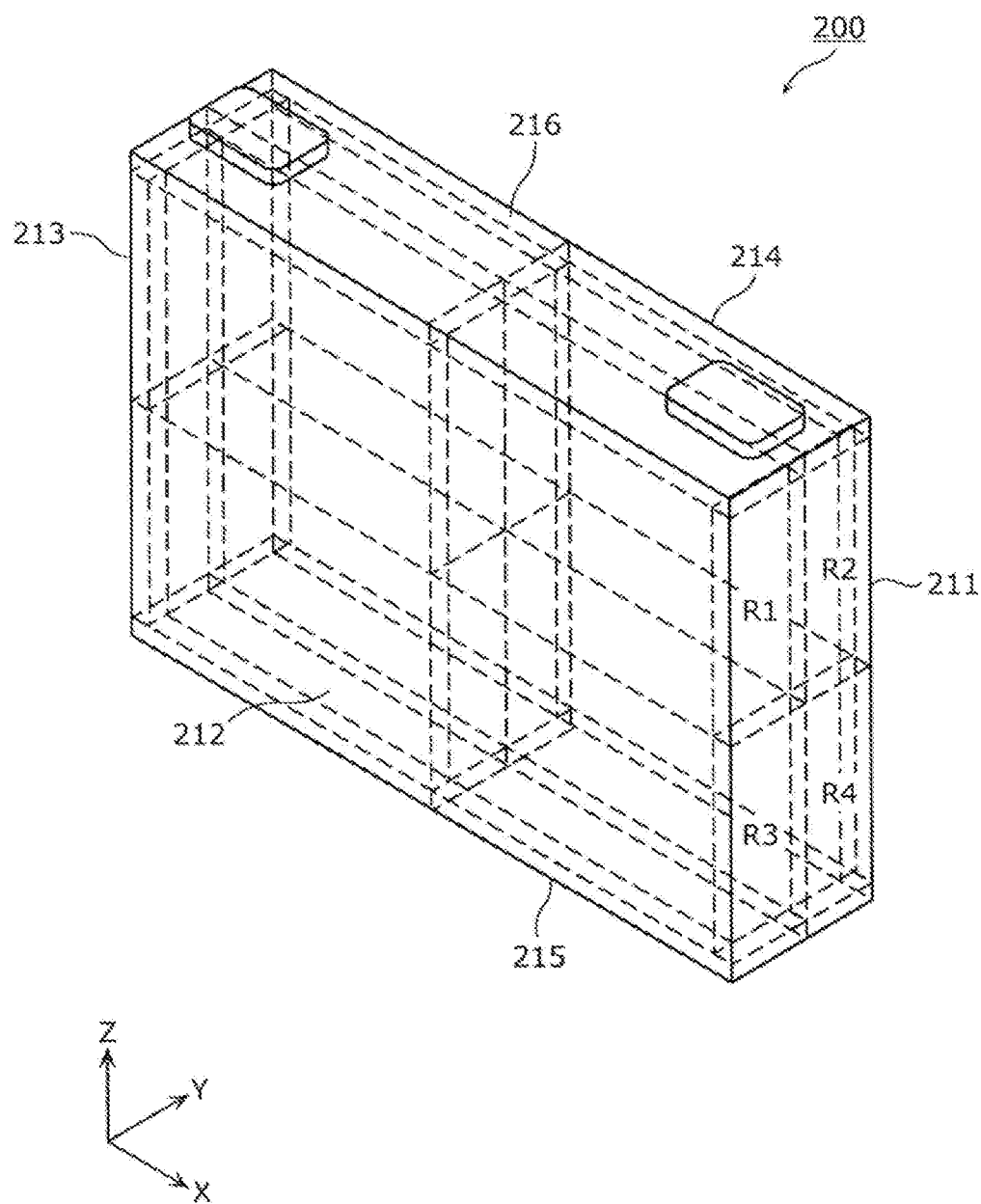
FIG. 6 is a view for describing an internal region and a neighboring region of the energy storage device according to the embodiment.

In this embodiment, "internal region" is the internal region of the energy storage device 200, and "adjacently disposed region" is a region disposed adjacently to the internal region, and information indicative of the "internal region" and the "adjacently disposed region" is stored in "internal region" and "adjacently disposed region" respectively in advance. The internal region and the adjacently disposed region are described in detail with reference to FIG. 6. FIG. 6 is a view for describing the internal region and a neighboring region of the energy storage device 200 according to the embodiment. To be more specific, FIG. 6 is a perspective view showing a state where the energy storage device 200 is divided into a plurality of regions.

As shown in FIG. 6, the energy storage device 200 is divided into the plurality of regions by being imaginarily cut along planes parallel to an XY plane, a YZ plane and an XZ plane. That is, respective portions (side walls 211 to 214, a bottom wall 215, a lid body 216, and two electrode assemblies 261, 262 and the like of the case 210) which form the energy storage device 200 are divided into a plurality of regions. These divided regions respectively form the internal regions of the energy storage device 200. That is, in a state where the energy storage device 200 is divided into the plurality of regions, the respective regions are defined as internal regions.

The internal region disposed adjacently to the internal region is defined as adjacently disposed region. For example, the internal region R1 and the internal region R2 are disposed adjacently to each other, the internal region R2 is defined as the adjacently disposed region with respect to the internal region R1. In the same manner, the internal region R3 is also defined as the adjacently disposed region with respect to the internal region R1. The external region is also included in the adjacently disposed region. That is, the outermost internal region of the energy storage device 200 is disposed adjacently to the outside of the energy storage device 200 and hence, it is assumed that the region outside the energy storage device 200 disposed adjacently to the internal region is defined as the external region.

Figure 7:
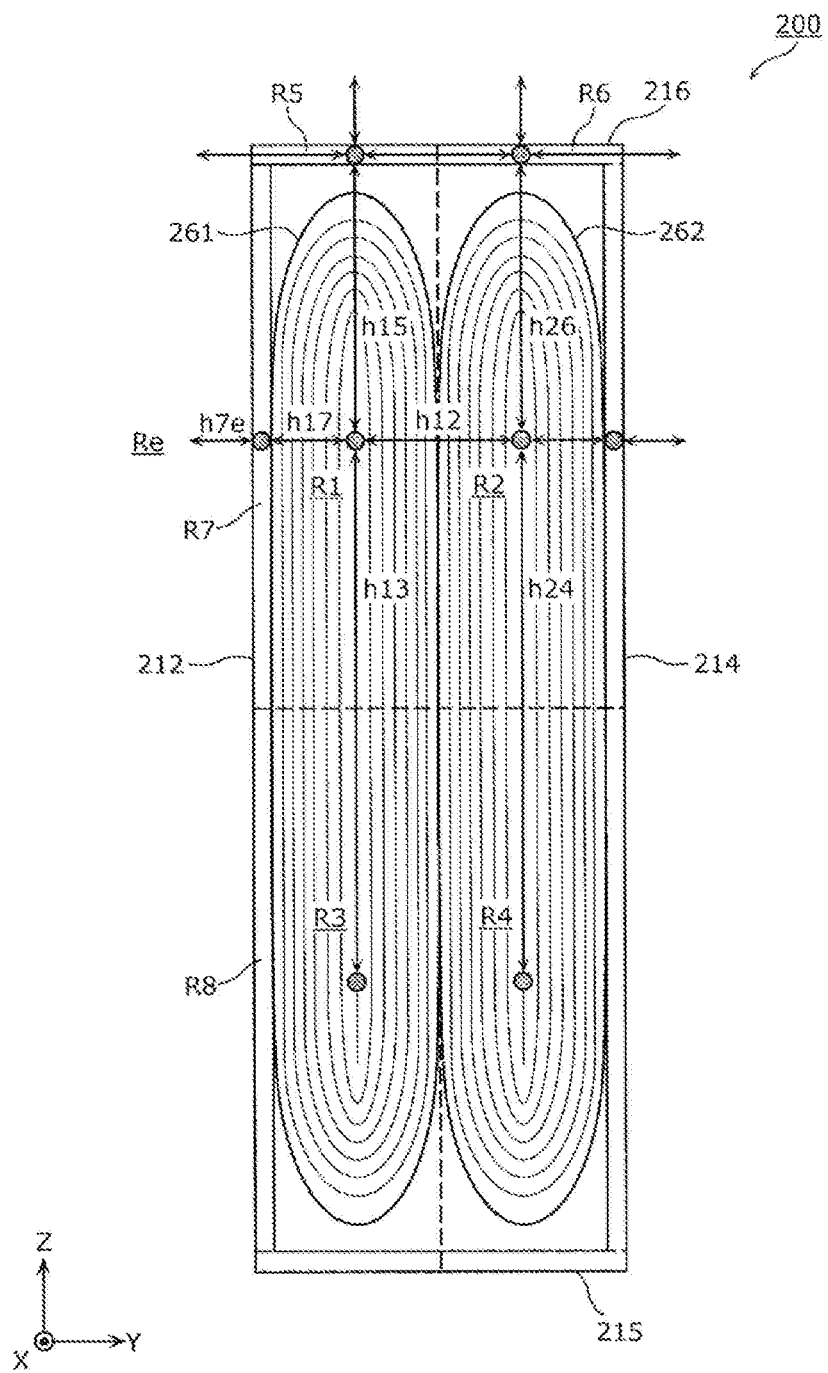
FIG. 7 is a view for describing a heat transfer coefficient of the energy storage device according to the embodiment.

Returning to FIG. 5, in "heat transfer coefficient", respective heat transfer coefficients each of which is a heat transfer coefficient between two internal regions disposed adjacently to each other, and respective heat transfer coefficients each of which is a heat transfer coefficient between the internal region and the external region disposed adjacently to each other are stored in advance. These heat transfer coefficients are described in detail with reference to FIG. 7. FIG. 7 is a view for describing the heat transfer coefficients of the energy storage device 200 according to this embodiment. To be more specific, FIG. 7 is a view of the internal regions of the energy storage device 200 shown in FIG. 6 as viewed from a plus side in an X axis direction.

In FIG. 7, as an example, the internal region obtained by dividing the inside of the case 210 of the energy storage device 200 in four as viewed from a plus side in an X axis direction are defined as internal regions R1 to R4. The internal regions obtained by dividing the lid body 216 of the case 210 in two as viewed from a plus side in the X axis direction are defined as internal regions R5, R6. The internal regions obtained by dividing the side wall 212 of the case 210 in two as viewed from a plus side in the X axis direction are defined as internal regions R7, R8. Further, the center of each internal region is indicated by a black dot.

A heat transfer coefficient between two internal regions arranged in a stacking direction of the plates of the electrode assembly 261, 262 is defined as a first heat transfer coefficient. A heat transfer coefficient between two internal regions arranged in a direction which intersects with the stacking direction is referred to as a second heat transfer coefficient. For example, a heat transfer coefficient between the internal region R1 and the internal region R2 is defined as a first heat transfer coefficient h12, and a heat transfer coefficient between the internal region R1 and the internal region R7 is defined as a first heat transfer coefficient h17. Further, a heat transfer coefficient between the internal region R1 and the internal region R3 is defined as a second heat transfer coefficient h13, and a heat transfer coefficient between the internal region R2 and the internal region R4 is defined as a second heat transfer coefficient h24.

In this embodiment, a heat transfer coefficient in a planar direction of the plates is larger than a heat transfer coefficient in a stacking direction of the plates and hence, a second heat transfer coefficient is a value larger than a first heat transfer coefficient. That is, a base material layer (current collecting foil) having a large heat transfer coefficient extends in a planar direction of the plate without interruption and hence, a second heat transfer coefficient becomes large. On the other hand, a base material layer (current collecting foil) having a large heat transfer coefficient and an active material layer having a small heat transfer coefficient are made to overlap with each other in a stacking direction and hence, a first heat transfer coefficient becomes small. In this manner, the first heat transfer coefficient and the second heat transfer coefficient can be calculated based on the heat transfer coefficients of the base material layer and the active material layer of the plate.

That is, in "heat transfer coefficient", the first heat transfer coefficients and the second heat transfer coefficients larger than the first heat transfer coefficients are stored. The heat transfer coefficient in the case where the adjacently disposed region is the external region is also stored in "heat transfer coefficient" such as the heat transfer coefficient h7e between the internal region R7 and the external region Re. FIG. 7 is shown as a two-dimensional view extending in a Y axis direction and in a Z axis direction. However, as shown in FIG. 6, the internal regions exist three dimensionally including an X axis direction. Accordingly, a heat transfer coefficient between the internal regions in the Z axis direction and a heat transfer coefficient between the internal region and the external region in the Z axis direction are also stored in "heat transfer coefficient".

Returning to FIG. 5, heat values of the respective internal regions are stored in "heat value" in advance. Temperatures of the respective internal regions calculated at the respective points of time are stored in "temperature".

Next, returning to FIG. 3, processing which the temperature estimation part 110 performs is described. The temperature estimation part 110 estimates a temperature of each energy storage device 200. To be more specific, the temperature estimation part 110 estimates a temperature of the energy storage device 200 using an internal heat transfer amount which is a transfer amount of heat between two internal regions disposed adjacently to each other and an external heat transfer amount which is a transfer amount of heat between the internal region and the external region disposed adjacently to each other.

In this embodiment, processing which the temperature estimation part 110 performs is specifically described by describing processing which the heat generation amount acquisition part 111, the heat transfer amount acquisition part 112 and the temperature calculation part 113 which the temperature estimation part 110 includes respectively perform.

The heat generation amount acquisition part 111 acquires heat generation amounts in the respective internal regions of the energy storage device 200. To be more specific, the heat generation amount acquisition part 111 reads out data from the charge-discharge history data 131 and calculates an entire heat generation amount of the energy storage device 200, and acquires heat generation amounts of the respective internal regions of the energy storage device 200 by allocating the calculated heat generation amount to the respective internal regions of the energy storage device 200.

The heat transfer amount acquisition part 112 acquires a heat transfer amount between the respective regions. That is, the heat transfer amount acquisition part 112 calculates an internal heat transfer amount which is a transfer amount of heat between two internal regions disposed adjacently to each other in the energy storage device 200, and an external heat transfer amount which is a transfer amount of heat between the internal region and the external region disposed adjacently to each other. To be more specific, the heat transfer amount acquisition part 112 acquires a past temperature of the internal region and a past heat transfer coefficient of the internal region from estimation data 132, and a temperature (outside air temperature) of an external region from the charge-discharge history data 131, and calculates an internal heat transfer amount and an external heat transfer amount.

The temperature calculation part 113 estimates a temperature of the energy storage device 200. To be more specific, the temperature calculation part 113 calculates a temperature of the internal region using a heat generation amount in the internal region which the heat generation amount acquisition part 111 acquires and an internal heat transfer amount and an external heat transfer amount which the heat transfer amount acquisition part 112 acquires. Then, the temperature calculation part 113 calculates a temperature of the energy storage device 200 using the calculated temperature of the internal region.

The state estimation part 120 also estimates a state of the energy storage device 200 using a temperature of the energy storage device 200 which the temperature estimation part 110 has estimated. To be more specific, the state estimation part 120 estimates a degradation state indicative of a degree of degradation of performance of the energy storage device 200, abnormal state indicative of the occurrence of an abnormal behavior of the energy storage device 200 or the like.

Figure 8:
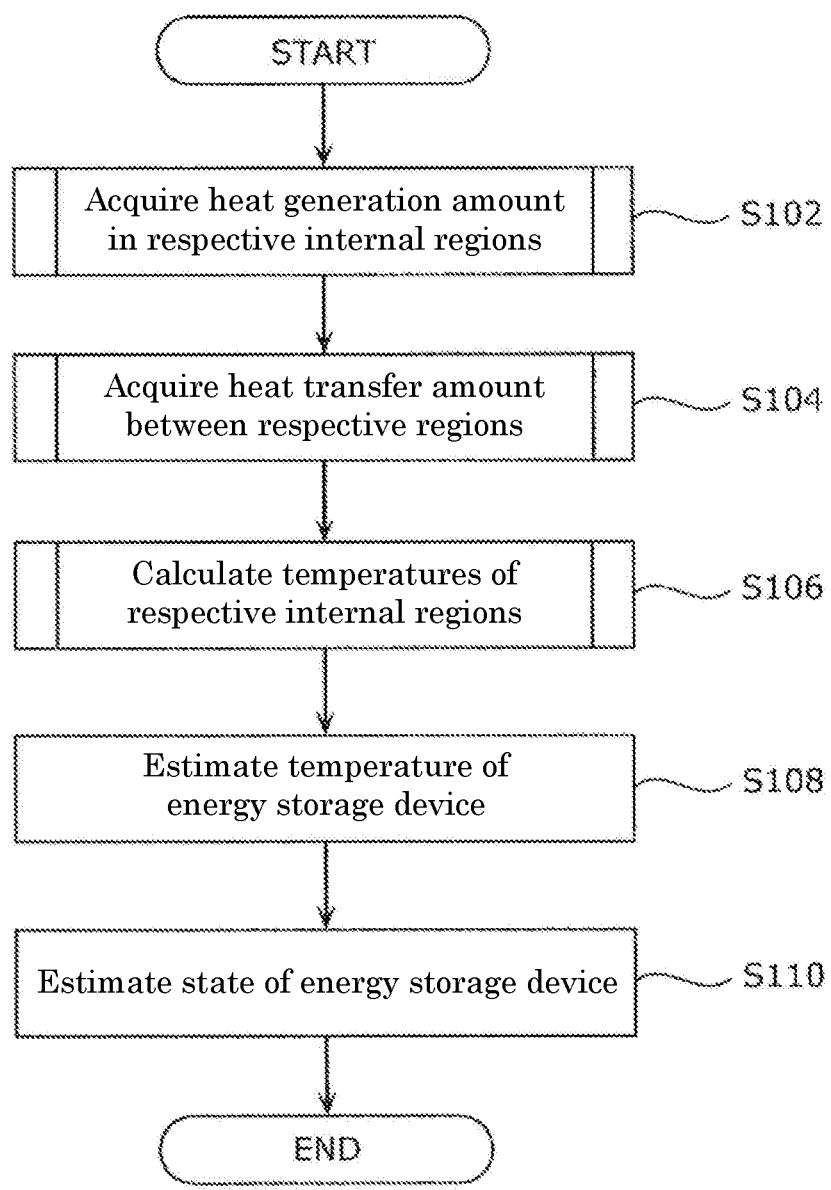
FIG. 8 is a flowchart showing one example of processing where the energy storage device state estimation device according to the embodiment estimates a state of the energy storage device.

Next, processing where the energy storage device state estimation device 100 estimates a state of the energy storage device 200 (processing performed by the temperature estimation part 110 and the state estimation part 120) is described in further detail. FIG. 8 is a flowchart showing one example of processing where the energy storage device state estimation device 100 according to this embodiment estimates a state of the energy storage device 200.

As shown in FIG. 8, firstly, the temperature estimation part 110 estimates temperatures of the respective energy storage devices 200 (S102 to S108).

Figure 9:
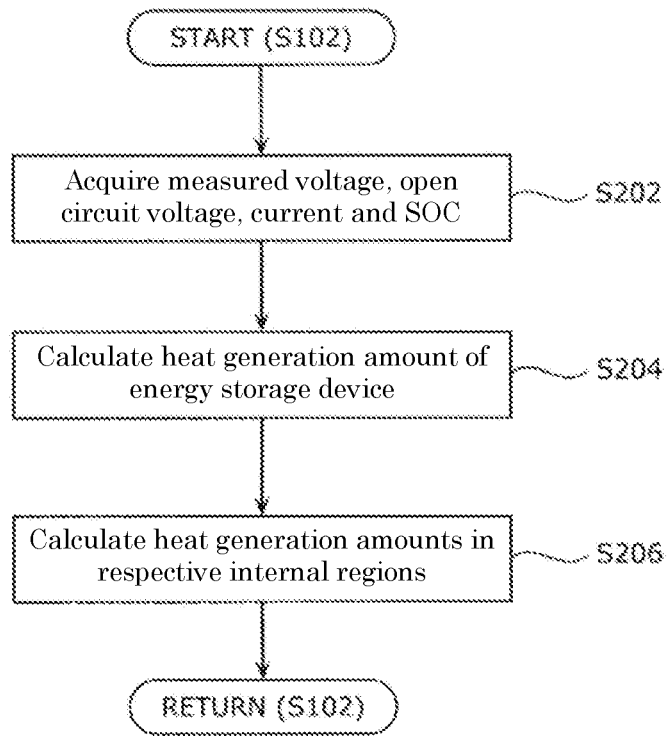
FIG. 9 is a flowchart showing one example of processing where a heat generation amount acquisition part according to the embodiment acquires heat generation amounts in respective internal regions of the energy storage device.

To be more specific, the heat generation amount acquisition part 111 acquires heat generation amounts in the respective internal regions of the energy storage device 200 (S102). The processing where the heat generation amount acquisition part 111 acquires heat generation amounts in the respective internal regions of the energy storage device 200 is described in detail with reference to FIG. 9. FIG. 9 is a flowchart showing one example of processing where the heat generation amount acquisition part 111 according to this embodiment acquires heat generation amounts in respective internal regions of the energy storage device 200.

As shown in FIG. 9, the heat generation amount acquisition part 111 firstly acquires a measured voltage, an open circuit voltage, a current, and an SOC of the energy storage device 200 (S202).

To be more specific, the heat generation amount acquisition part 111 is connected to the energy storage device 200. The heat generation amount acquisition part 111 acquires (measures) a voltage and a current at the time of charging or discharging of the energy storage device 200 from the energy storage device 200, and makes the memory 130 store the voltage and the current in "measured voltage" and "current" of charge-discharge history data 131 by writing. The heat generation amount acquisition part 111 also estimates (calculates) an SOC based on the acquired voltage and current, and makes the memory 130 store the SOC in "SOC" of charge-discharge history data 131.

Figure 10:
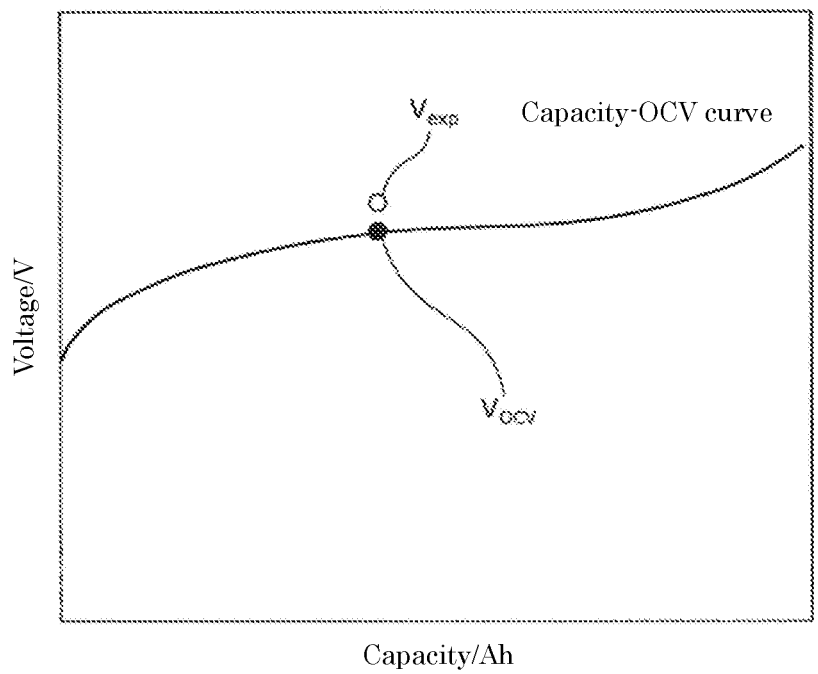
FIG. 10 is a view showing one example of a capacity-OCV curve of the energy storage device according to the embodiment.

The heat generation amount acquisition part 111 also acquires an open circuit voltage of the energy storage device 200 based on a capacity-OCV curve indicative of a relationship between a capacity and the open circuit voltage of the energy storage device 200 shown in FIG. 10, for example, and makes the memory 130 store the acquired open circuit voltage in "open circuit voltage" of charge-discharge history data 131 by writing. FIG. 10 is a view showing one example of a capacity-OCV curve of the energy storage device 200 according to this embodiment. To be more specific, the heat generation amount acquisition part 111 calculates a capacity based on acquired current and voltage, and calculates an open circuit voltage by assigning the capacity to the capacity-OCV curve shown in FIG. 10. FIG. 10 also indicates a measured open circuit voltage with respect to the energy storage device 200. That is, a difference is generated between an open circuit voltage and a measured voltage corresponding to heat generation of the energy storage device 200. The capacity-OCV curve is stored in charge-discharge history data 131 in advance.

With such a step, the heat generation amount acquisition part 111 can acquire a measured voltage, an open circuit voltage, a current, and an SOC of the energy storage device 200 which is an object to be measured at a point of time of charging or discharging from charge-discharge history data 131.

Returning to FIG. 9, the heat generation amount acquisition part 111 calculates a heat generation amount of the energy storage device 200 (S204). To be more specific, the heat generation amount acquisition part 111 calculates a heat generation amount $\delta Q$ of the entire energy storage device 200 in accordance with a following formula 1.

$$\delta Q = |V_{exp} - V_{OCV}| \times I \times \Delta t + B \quad \text{(formula 1)}$$

In the formula, $V_{exp}$ indicates a measured voltage of the energy storage device 200, $V_{OCV}$ indicates an estimated value of an open circuit voltage of the energy storage device 200, and I indicates a current of the energy storage device 200. $\Delta t$ indicates a preset value (calculation cycle) such as 10 seconds, for example. In this embodiment, $\Delta t$ indicates a time interval of charge-discharge history data 131 at a point of time of charging or discharging. B indicates a heat absorption or generation amount generated along with a change in an SOC of the energy storage device 200. B can be acquired based on a change in an SOC within a predetermined period $\Delta t$.

The heat generation amount acquisition part 111 calculates a heat absorption or generation amount B based on an amount of change in an acquired SOC, and calculates a heat generation amount $\delta Q$ of the entire energy storage device 200 by assigning the heat absorption or generation amount B, an acquired measured voltage $V_{exp}$, an open circuit voltage $V_{OCV}$, and a current I to the above-mentioned formula 1.

In calculating the heat generation amount $\delta Q$, when a value of the current I is extremely small (when the current I is a minute current), the calculation is relatively largely affected by the heat absorption or generation amount B and hence, a term of the heat absorption or generation amount B cannot be ignored. The value of the current I with which the heat generation amount $\delta Q$ of the entire energy storage device 200 is largely affected by the heat absorption or generation amount B depends on magnitude of internal resistance of the energy storage device 200 or the like. In the case where the energy storage device 200 is a general-use lithium ion secondary battery, for example, the term of the heat absorption or generation amount B particularly affects the calculation of the heat generation amount $\delta Q$ when the value of the current I is 1.0 CA or below, and the term of the heat absorption or generation amount B conspicuously affects the calculation of the heat generation amount $\delta Q$ when the value of the current I is 0.2 CA or below. On the other hand, when the value of the current I is large, an amount that the heat absorption or generation amount B affects the calculation of the heat generation amount $\delta Q$ becomes relatively small and hence, the heat generation amount $\delta Q$ may be calculated by ignoring the term of the heat absorption or generation amount B.

The heat absorption or generation amount B is described in further detail. In general, a change in Gibbs free energy $\Delta G$ when a chemical change occurs at a constant temperature and a constant pressure is expressed by a following formula 2.

$$\Delta G = \Delta H - T\Delta S \quad \text{(formula 2)}$$

$\Delta H$ indicates a change amount of enthalpy, T indicates a thermodynamic temperature, and $\Delta S$ indicates a change amount of entropy. Due to a change in chemical composition of a positive active material or a negative active material brought about by a charge-discharge reaction in an energy storage device, $\Delta H$ and $\Delta S$ change.

In this case, a quasi-static reaction, that is, inputting or outputting of heat $\Delta Q_{rev}$ when a current value is regarded as approximately 0, such inputting or outputting of heat $\Delta Q_{rev}$ is expressed by $\Delta Q_{rev} = T\Delta S$ in accordance with the definition of entropy. That is, the absorption or generation amount B in the formula 1 which does not depend on a current value is brought about due to the second term of this formula 2. Also in this case, $\Delta Q_{rev}$ is indicated using a unit of J/mol and hence, an actual heat absorption or generation amount B can be obtained based on magnitude of a change in an SOC brought about by an actual charge-discharge reaction. For example, in the case where an average current I supplied to the system and a current supply time $\Delta t$ are known, it is considered that a reaction has occurred by an amount of $I\Delta t/(nF)$mol (n: stoichiometric coefficient of an electron in a half-reaction of a battery reaction, F: Faraday constant) and hence, the reversible heat absorption or generation amount B in the energy storage device can be expressed by a following formula 3.

$$B = -T\Delta S \times I\Delta t/(nF) \quad \text{(formula 3)}$$

In this manner, the heat generation amount acquisition part 111 calculates a heat generation amount $\delta Q$ of the entire energy storage device 200 using a heat generation amount ($|V_{exp} - V_{OCV}| \times I \times \Delta t$) which is calculated based on a difference between a measured voltage $V_{exp}$ and an open circuit voltage $V_{OCV}$ of the energy storage device 200 during a predetermined period $\Delta t$ and a current value I, and a heat absorption or generation amount B obtained based on a change in SOC during the predetermined period $\Delta t$.

Then, the heat generation amount acquisition part 111 calculates heat generation amounts in the respective internal regions of the energy storage device 200 (S206). To be more specific, the heat generation amount acquisition part 111 allocates the calculated heat generation amount $\delta Q$ of the energy storage device 200 to the respective internal regions of the energy storage device 200. For example, the heat generation amount acquisition part 111 allocates the heat generation amount $\delta Q$ in accordance with a ratio of heat values in the respective internal regions, allocates the heat generation amount $\delta Q$ in accordance with a ratio of volumes of the respective internal regions, or uniformly allocates the heat generation amount $\delta Q$ among the respective internal regions. Accordingly, the heat generation amount acquisition part 111 can acquire heat generation amounts in the respective internal regions of the energy storage device 200.

In accordance with the above-mentioned operations, processing of acquiring heat generation amounts in the respective internal regions of the energy storage device 200 by the heat generation amount acquisition part 111 (S102 in FIG. 8) is finished.

Next, returning to FIG. 8, the heat transfer amount acquisition part 112 acquires heat transfer amounts between the respective regions (S104). That is, the heat transfer amount acquisition part 112 calculates an internal heat transfer amount which is a transfer amount of heat between two internal regions disposed adjacently to each other in the energy storage device 200, and an external heat transfer amount which is a transfer amount of heat between the internal region and the external region disposed adjacently to each other using heat transfer coefficients stored in the memory 130. To be more specific, the heat transfer amount acquisition part 112 calculates an internal heat transfer amount and an external heat transfer amount from a first point of time to a second point of time using a temperature of the internal region and a temperature of the external region at the first point of time.

The second point of time is a point of time at which the temperature estimation part 110 estimates temperatures of the respective internal regions of the energy storage device 200, and the first point of time is a point of time before the second point of time. For example, the first point of time is a point of time one stage earlier than the second point of time at a point of time of charging or discharging in charge-discharge history data 131.

Figure 11:
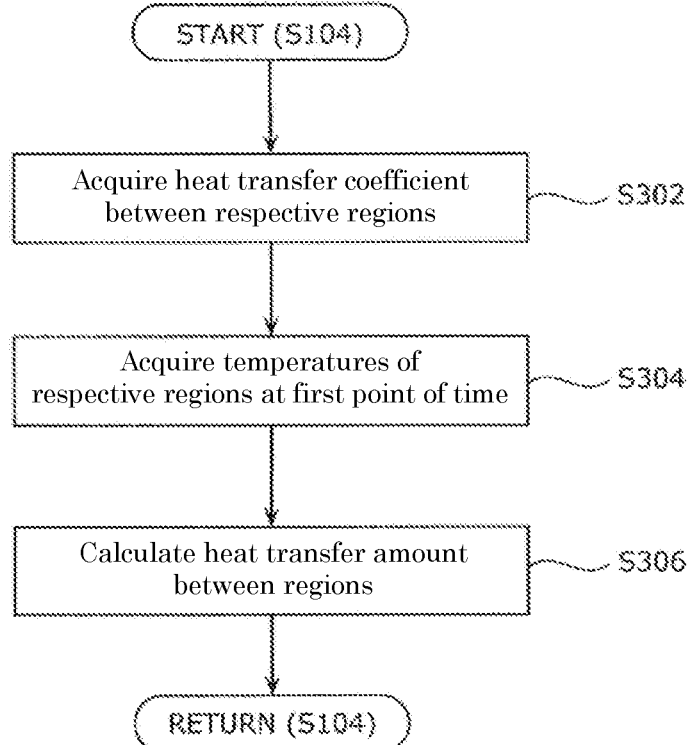
FIG. 11 is a flowchart showing one example of processing where a heat transfer amount acquisition part according to the embodiment acquires a heat transfer amount between the respective regions.

Processing of acquiring a heat transfer amount between the respective regions by the heat transfer amount acquisition part 112 is described in further detail with reference to FIG. 11. FIG. 11 is a flowchart showing one example of processing where the heat transfer amount acquisition part 112 according to this embodiment acquires a heat transfer amount between the respective regions.

As shown in FIG. 11, the heat transfer amount acquisition part 112 acquires heat transfer coefficients between the respective regions (S302). That is, the heat transfer amount acquisition part 112 reads a heat transfer coefficient between two internal regions disposed adjacently to each other and a heat transfer coefficient between the internal region and the external region dispose adjacently to each other from estimation data 132.

The heat transfer amount acquisition part 112 also acquires temperatures of the respective regions (temperatures of the internal regions and a temperature of the external region) at a first point of time (S304). To be more specific, the heat transfer amount acquisition part 112 reads temperatures of the internal regions at the first point of time from "temperature" in estimation data 132. That is, the heat transfer amount acquisition part 112 acquires the temperatures of the internal regions which the temperature calculation part 113 described later calculates at one preceding point of time by reading from estimation data 132. Although the temperature calculation part 113 does not calculate past temperatures of the internal regions in an initial state, in this case, the heat transfer amount acquisition part 112 acquires temperatures of the internal regions by assuming that the temperatures of the respective internal regions are all equal to a temperature of the external region.

The heat transfer amount acquisition part 112 also acquires a temperature of a space where the energy storage device 200 is disposed as a temperature of the external region. That is, the heat transfer amount acquisition part 112 reads an outside air temperature stored in charge-discharge history data 131, and acquires the outside air temperature as a temperature of the external region. For example, with respect to the outside air temperature, the heat transfer amount acquisition part 112 acquires (measures) a temperature of a space where the energy storage device 200 is disposed by a temperature sensor or the like disposed in the space, and makes the memory 130 store the temperature of the space in "outside air temperature" of charge-discharge history data 131 by writing. In this case, an existing sensor such as a sensor mounted in an automobile, for example, may be used as the temperature sensor. It is preferable that the temperature sensor be disposed in a spaced-apart manner from the energy storage device 200 to an extent that the temperature sensor is not affected by heat which the energy storage device 200 generates.

The heat transfer amount acquisition part 112 calculates a heat transfer amount between the respective regions (S306). To be more specific, the heat transfer amount acquisition part 112 calculates an internal heat transfer amount $\delta J_{R_xR_y}$ from a first point of time to a second point of time using a following formula 4, and calculates an external heat transfer amount $\delta J_{R_xR_e}$ from the first point of time to the second point of time using a following formula 5.

$$\delta J_{R_xR_y} = h_{R_xR_y} \times (T_{Rx} - T_{Ry}) \times \Delta t \quad \text{(formula 4)}$$

$$\delta J_{R_xR_e} = h_{R_xR_e} \times (T_{Rx} - T_{Re}) \times \Delta t \quad \text{(formula 5)}$$

In these formulae, $\delta J_{R_xR_y}$ indicates a heat transfer amount (heat radiation amount) from the internal region Rx to the internal region Ry, and $\delta J_{R_xR_e}$ indicates a heat transfer amount (heat radiation amount) from the internal region Rx to the external region Re. $h_{R_xR_y}$ indicates a heat transfer coefficient between the internal region Rx and the internal region Ry, and $h_{R_xR_e}$ indicates a heat transfer coefficient between the internal region Rx and the external region Re. $T_{Rx}$ indicates a temperature of the internal region Rx at the first point of time, $T_{Ry}$ indicates a temperature of the internal region Ry at the first point of time, and $T_{Re}$ indicates a temperature of the external region Re at the first point of time.

The heat transfer amount acquisition part 112 calculates heat transfer amounts (internal heat transfer amounts and an external heat transfer amount) between the respective regions by assigning the acquired heat transfer coefficients ($h_{R_xR_y}$, $h_{R_xR_e}$), the temperatures ($T_{Rx}$, $T_{Ry}$) of the internal regions and the temperature ($T_{Re}$) of the external region to the above-mentioned formula 4 and formula 5.

In accordance with the above-mentioned operations, processing of acquiring heat transfer amounts between the respective regions by the heat transfer amount acquisition part 112 (S104 in FIG. 8) is finished.

Next, returning to FIG. 8, the temperature calculation part 113 calculates temperatures of the respective internal regions of the energy storage device 200 (S106). To be more specific, the temperature calculation part 113 calculates temperatures of the internal regions using heat generation amounts in the internal regions which the heat generation amount acquisition part 111 calculates and the internal heat transfer amounts and the external heat transfer amount which the heat transfer amount acquisition part 112 calculates.

Figure 12:
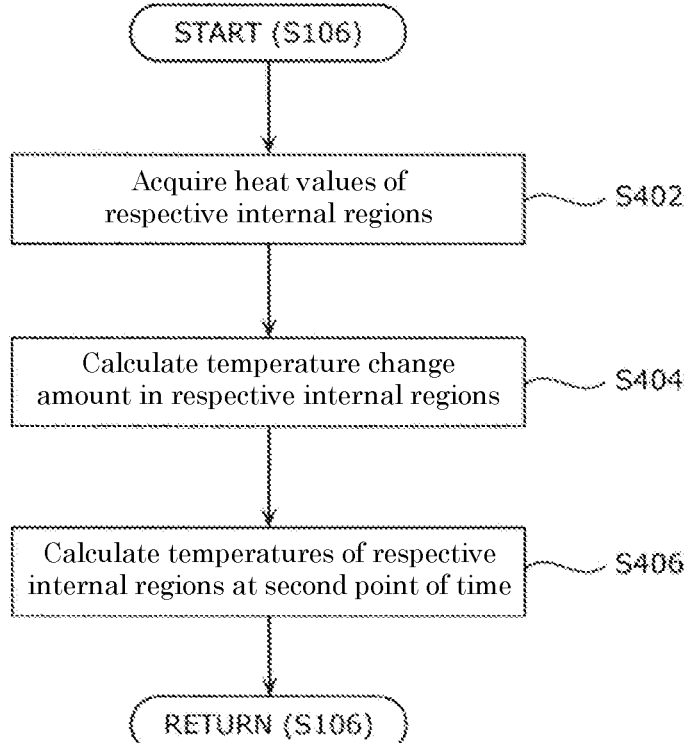
FIG. 12 is a flowchart showing an example of processing where a temperature calculation part according to the embodiment calculates temperatures of respective internal regions of the energy storage device.

Processing of calculating temperatures of the respective internal regions of the energy storage device 200 by the temperature calculation part 113 is described in further detail with reference to FIG. 12. FIG. 12 is a flowchart showing an example of processing where a temperature calculation part 113 according to the embodiment calculates temperatures of respective internal regions of the energy storage device 200.

As shown in FIG. 12, the temperature calculation part 113 acquires heat values of the respective internal regions of the energy storage device 200 (S402). To be more specific, the temperature calculation part 113 reads heat values of the respective internal regions of the energy storage device 200 from estimation data 132.

The temperature calculation part 113 calculates temperature change amounts in the respective internal regions of the energy storage device 200 (S404). To be more specific, the temperature calculation part 113 calculates temperature change amounts $\delta T_{Rx}$ of the internal regions Rx from a first point of time to the second point of time using a following formula 6.

$$\delta T_{Rx}=(\delta Q_{Rx}-\Sigma\delta J_{RxRy}-\delta J_{RxRe})/C_{Rx} \quad \text{(formula 6)}$$

In this formula 6, $\delta Q_{Rx}$ indicates a heat generation amount in the internal region Rx from the first point of time to the second point of time. $\Sigma\delta J_{RxRy}$ indicates a total value of internal heat transfer amounts each of which is an internal heat transfer amount between the internal region Rx and the internal region Ry disposed adjacently to the internal region Rx. $C_{Rx}$ indicates a heat value of the internal region Rx. When the internal region Rx is not disposed adjacently to the external region Re, $\delta J_{RxRe}$ becomes 0 ($\delta J_{RxRe}$=0).

Figure 13:
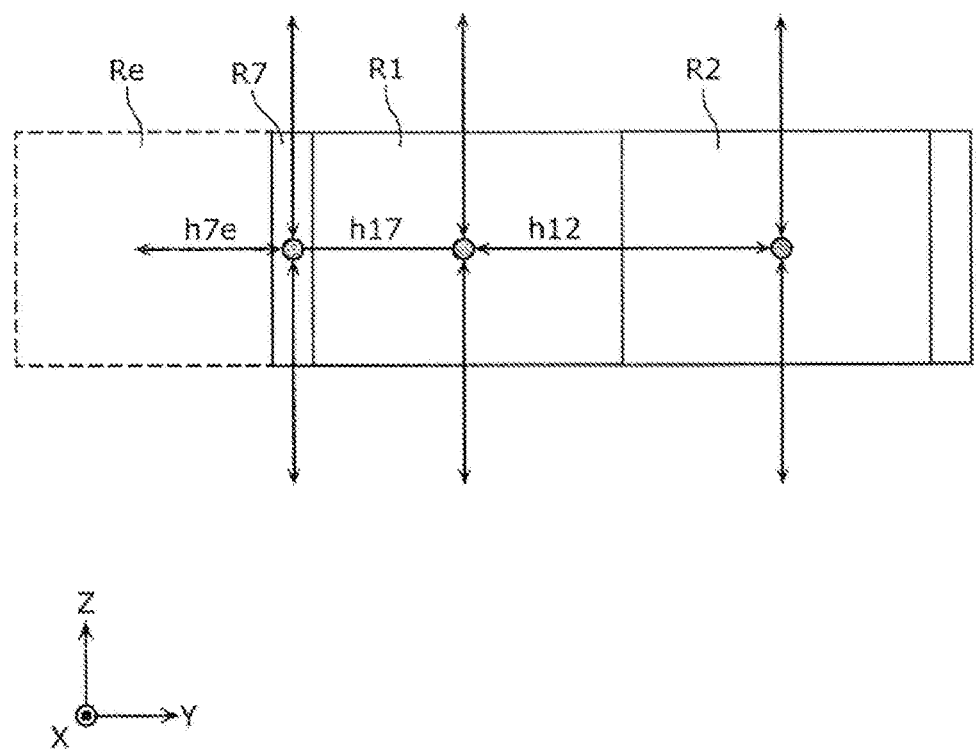
FIG. 13 is a view for describing processing where the temperature calculation part according to the embodiment calculates temperature change amounts of the internal regions.

For example, as shown in FIG. 13, with respect to the internal region R1, the heat transfer is performed between the internal region R1 and the internal region R2, the internal region R7 and the like disposed adjacently to the internal region R1. With respect to the internal region R7, the heat transfer is performed between the internal region R7 and the internal region R1, the external region Re and the like disposed adjacently to the internal region R7. FIG. 13 is a view for describing processing where the temperature calculation part 113 according to the embodiment calculates temperature change amounts of the internal regions. FIG. 13 is shown as a two-dimensional view extending in a Y axis direction and in a Z axis direction. However, the internal regions exist three dimensionally including an X axis direction. Accordingly, heat transfer is performed also between the internal regions in a Z axis direction and between the internal regions and the external region.

The temperature calculation part 113 calculates temperature change amounts $\delta T_{Rx}$ of the internal regions Rx from the first point of time to the second point of time by assigning acquired heat values ($C_{Rx}$), heat generation amount ($\delta Q_{Rx}$) acquired from the heat generation amount acquisition part 111, and the respective heat transfer amounts ($\delta J_{RxRy}$, $\delta J_{RxRe}$) acquired from the heat transfer amount acquisition part 112 to the above-mentioned formula 6.

Returning to FIG. 12, the temperature calculation part 113 calculates temperatures of the respective internal regions at the second point of time (S406). To be more specific, the temperature calculation part 113 calculates the temperatures of the internal regions Rx at the second point of time by adding calculated temperature change amounts $\delta T_{Rx}$ to the temperatures $T_{Rx}$ of the internal regions Rx at the first point of time. Then, the temperature calculation part 113 writes calculated temperatures of the internal regions at the second point of time in estimation data 132. In this manner, the temperature estimation part 110 repeatedly estimates the temperatures of the respective internal regions of the energy storage device 200, and writes the temperatures of the respective internal regions in estimation data 132.

In accordance with the above-mentioned operations, processing of calculating temperatures of the respective internal regions of the energy storage device 200 by the temperature calculation part 113 (S106 in FIG. 8) is finished.

Next, returning to FIG. 8, the temperature calculation part 113 estimates a temperature of the energy storage device 200 using the calculated temperatures of the internal regions (S108). That is, the temperature calculation part 113 reads the temperature of the internal region at a point of time where the estimation of a temperature of the energy storage device 200 is desired from estimation data 132, and estimates a temperature of the energy storage device 200 in a single unit basis. To be more specific, the temperature calculation part 113 calculates, among temperatures of the internal regions obtained using the internal heat transfer amounts and the external heat transfer amount, the temperature of the internal region disposed at the center position of the energy storage device 200 or an average value of temperatures of the respective internal regions as the temperature of the energy storage device 200.

The temperature calculation part 113 may calculate a temperature of the electrode assembly at the center position of the electrode assembly as the temperature of the energy storage device 200, for example in place of the temperature of the internal region at the center position of the energy storage device 200. Further, in calculating an average value of the temperatures of the internal regions, the temperature calculation part 113 may calculate the temperature of the energy storage device 200 by dividing a total value of the temperatures by the number of the internal regions, or may calculate the temperature of the energy storage device 200 by adopting a weighted average where the temperatures of the internal regions are weighed by volumes or magnitudes of heat values of the respective internal regions.

Then, the state estimation part 120 estimates a state of the energy storage device 200 using the temperature of the energy storage device 200 (S110). That is, the state estimation part 120 reads the temperature of the energy storage device 200 from estimation data 132, and estimates the state of the energy storage device 200. To be more specific, the state estimation part 120 estimates a degradation state indicative of a degree of degradation of performance of the energy storage device 200, abnormal state indicative of the occurrence of an abnormal behavior of the energy storage device 200 or the like. For example, the state estimation part 120 estimates a degradation state of capacity indicative of the decrease of reversible capacity of the energy storage device 200 in terms of %. Then, the state estimation part 120 writes an estimation result of the state of the energy storage device 200 in estimation data 132.

In accordance with the above-mentioned operations, processing of estimating the state of the energy storage device 200 by the energy storage device state estimation device 100 is finished.

As has been described above, according to the energy storage device state estimation device 100 of this embodiment, the energy storage device state estimation device 100 estimates a temperature of the energy storage device 200 using an internal heat transfer amount which is a transfer amount of heat between the two internal regions disposed adjacently to each other of the energy storage device 200 and an external heat transfer amount which is a transfer amount of heat between the internal region and the external region disposed adjacently to each other of the energy storage device 200, and estimates a state of the energy storage device 200 using the temperature. In this manner, according to the energy storage device state estimation device 100, a temperature of the energy storage device 200 can be estimated using an internal heat transfer amount and an external heat transfer amount and hence, the number of temperature sensors for measuring the temperature of the energy storage device 200 can be reduced or it is unnecessary to use the temperature sensors. Accordingly, it is possible to estimate a state of the energy storage device 200 by estimating a temperature of the energy storage device 200 using the simple configuration.

Further, the energy storage device state estimation device 100 stores a heat transfer coefficient between two internal regions and a heat transfer coefficient between the internal region and the external region in the memory, and calculates the internal heat transfer amount and the external heat transfer amount using the heat transfer coefficients stored in the memory. That is, there is a possibility that the heat transfer coefficient differs depending on the respective regions and hence, the heat transfer coefficients of the respective regions are stored in the memory, and these heat transfer coefficients are used in the calculation. Accordingly, the energy storage device state estimation device 100 can estimate a state of the energy storage device 200 by calculating an internal heat transfer amount and an external heat transfer amount with high accuracy even when the temperature of the energy storage device 200 is not measured by temperature sensors.

In the energy storage device state estimation device 100, a first heat transfer coefficient which is a heat transfer coefficient in a stacking direction of the plates of the electrode assembly 261, 262, and a second heat transfer coefficient which is a heat transfer coefficient in a direction which intersects with the stacking direction and is larger than the first heat transfer coefficient are stored in the memory. That is, the heat transfer coefficient in a planar direction of the plates becomes larger than the heat transfer coefficient in a stacking direction of the plates. According to the energy storage device state estimation device 100, it is possible to estimate a state of the energy storage device 200 by estimating a temperature of the energy storage device 200 with high accuracy by storing the accurate heat transfer coefficients in the memory.

The energy storage device state estimation device 100 calculates a temperature of the internal region at the second point of time which comes after the first point of time using a temperature of the internal region and a temperature of the external region at the first point of time, and estimates a temperature of the energy storage device 200. That is, the energy storage device state estimation device 100 updates the temperature of the internal region by using the temperature of the internal region and the temperature of the external region in the past. Accordingly, the energy storage device state estimation device 100 can estimate a state of the energy storage device 200 by accurately estimating the temperature of the energy storage device 200.

The energy storage device state estimation device 100 can use the temperature in a space where the energy storage device 200 is disposed (outside air temperature) as a temperature of the external region. Accordingly, the energy storage device state estimation device 100 can estimate a state of the energy storage device 200 by estimating a temperature of the energy storage device 200 easily.

By calculating a temperature of the internal region at a center position of the energy storage device 200 or an average value of temperatures of the respective internal regions as a temperature of the energy storage device 200, the energy storage device state estimation device 100 can estimate a state of the energy storage device 200 by estimating a temperature of the energy storage device 200 with high accuracy.

The energy storage device state estimation device 100 can estimate a temperature of the energy storage device 200 using a measured voltage, an open circuit voltage, a current value and a heat absorption or generation amount of the energy storage device 200 and hence, the number of temperature sensors for measuring a temperature of the energy storage device 200 can be reduced or it is unnecessary to use temperature sensors. Accordingly, it is possible to estimate a state of the energy storage device 200 by estimating a temperature of the energy storage device 200 using the simple configuration.

In general, it is known that the degradation of the energy storage device is accelerated along with the rise of a temperature. Although the likeliness of acceleration of degradation speed differs depending on a kind of an energy storage device, in general, when a temperature of the energy storage device rises 1° C. in the vicinity of a room temperature, the degradation speed of the energy storage device is accelerated approximately 5 to 10%. Accordingly, in the case where the accuracy of a temperature of the energy storage device is insufficient, the accuracy of estimation of a state of the energy storage device is lowered. Particularly, with respect to an energy storage device such as a lithium ion secondary battery where the degradation progresses in proportion to a test period of the power of 0.5, a period until a lifetime of the energy storage device changes in proportion to a degradation speed of the power of −2 and hence, a temperature of the energy storage device extremely largely affects accuracy of estimation of degradation of the energy storage device. Accordingly, to estimate a state of an energy storage device accurately, it is important to accurately measure or estimate a temperature of the energy storage device. Under such a circumstance, the energy storage device state estimation device 100 can accurately estimate a temperature of the energy storage device as described above and hence, the energy storage device state estimation device 100 is extremely useful.

(Modification 1)

Next, a modification 1 of the above-mentioned embodiment 1 is described. In the above-mentioned embodiment, the energy storage device 200 is divided into a relatively small number of regions as shown in FIG. 6, and only a relatively small number of heat transfer coefficients (first heat transfer coefficients, second heat transfer coefficient and the like) are stored in estimation data 132 of the memory 130 as shown in FIG. 7. However, in this modification, an energy storage device 200 is divided into a relatively large number of regions, and a relatively large number of heat transfer coefficients are stored in estimation data 132 as shown in FIG. 14.

Figure 14:
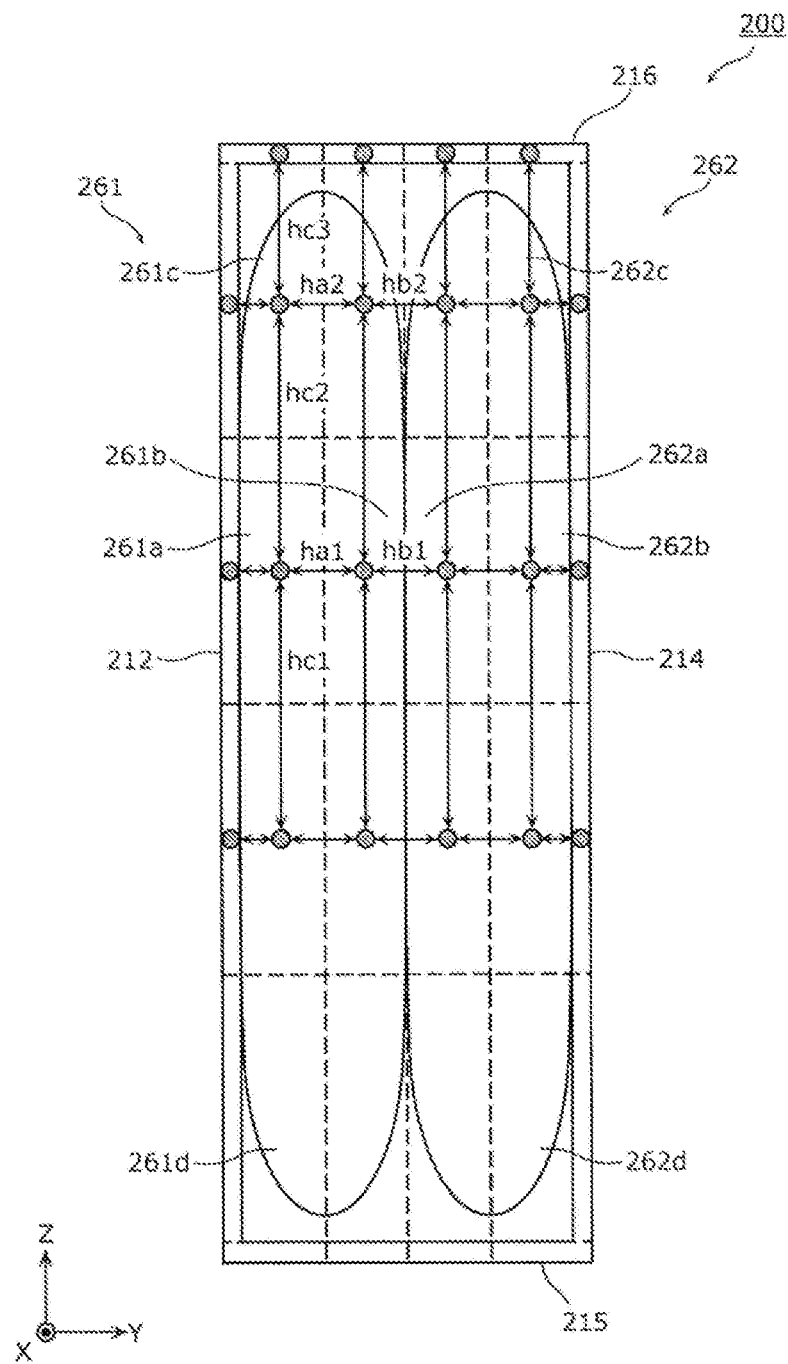
FIG. 14 is a view for describing a heat transfer coefficient of an energy storage device according to a modification 1.

FIG. 14 is a view for describing a heat transfer coefficient of the energy storage device 200 according to this modification. To be more specific, FIG. 14 is a view which corresponds to FIG. 7.

As shown in FIG. 14, in this modification, as viewed from a plus side in an X axis direction, the inside of a case 210 of the energy storage device 200 is divided into 16 (4×4) internal regions, and a lid body 216, side walls 212, 214, and a bottom wall 215 of the case 210 are respectively divided in four. The centers of main respective internal regions are indicated by black dots.

In FIG. 14, heat transfer coefficients ha1, ha2, hb1 and hb2 are heat transfer coefficients between two internal regions arranged in a stacking direction of plates of electrode assemblies 261, 262, and correspond to the first heat transfer coefficients in the above-mentioned embodiment. On the other hand, heat transfer coefficients hc1, hc2 and hc3 are heat transfer coefficients between two internal regions arranged in a direction which intersects with the stacking direction, and correspond to the second heat transfer coefficients in the above-mentioned embodiment.

In this modification 1, the electrode assembly 261, 262 is configured such that an outermost periphery of the electrode assembly 261, 262 is covered by a separator, an insulation sheet or the like in a state where a positive electrode plate and a negative electrode plate are not interposed. Accordingly, heat is less transferred between the electrode assembly 261 and the electrode assembly 262 compared to the inside of the electrode assembly 261 or the inside of the electrode assembly 262. Accordingly, the heat transfer coefficient between the different electrode assemblies takes a smaller value compared to the heat transfer coefficient in the inside of the same electrode assembly. In view of the above, with respect to the above-mentioned first heat transfer coefficients, assuming the heat transfer coefficients ha1 and ha2 as a third heat transfer coefficient and the heat transfer coefficients hb1 and hb2 as a fourth heat transfer coefficient, the fourth heat transfer coefficient (hb1, hb2) takes a smaller value compared to the third heat transfer coefficient (ha1, ha2).

Also as shown in FIG. 14, the electrode assembly 261 has flat portions 261a and 261b and bent portions 261c and 261d which are formed by winding plates. That is, the electrode assembly 261 is formed by winding the plates, and has two flat portions 261a and 261b which opposedly face each other and two bent portions 261c and 261d which connect such two flat portions 261a and 261b to each other. In the same manner, the electrode assembly 262 has two flat portions 262a and 262b and bent portions 262c and 262d which are formed by winding plates.

In the modification 1, the flat portion 261b of the electrode assembly 261 and the flat portion 262a of the electrode assembly 262 are brought into close contact with each other, while the bent portion 261c of the electrode assembly 261 and the bent portion 262c of the electrode assembly 262 are spaced apart from each other with a distance therebetween. Accordingly, heat is less transferred between the bent portions compared to between the flat portions of the different electrode assemblies and hence, the heat transfer coefficient between the bent portions takes a smaller value compared to the heat transfer coefficient between the flat portions of the different electrode assemblies. Accordingly, with respect to the above-mentioned fourth heat transfer coefficients (hb1, hb2), assuming the heat transfer coefficient hb1 as a fifth heat transfer coefficient and the heat transfer coefficient hb2 as a sixth heat transfer coefficient, the sixth heat transfer coefficient (hb2) takes a smaller value compared to the fifth heat transfer coefficient (hb1).

As described previously, in "heat transfer coefficient" of estimation data 132 of the memory 130, the third heat transfer coefficient which is the first heat transfer coefficient in the inside of the same electrode assembly and the fourth heat transfer coefficient which is the first heat transfer coefficient between the different electrode assemblies and is smaller than the third heat transfer coefficient are stored. Further, in "heat transfer coefficient", the fifth heat transfer coefficient which is the fourth heat transfer coefficient in the flat portion and the sixth heat transfer coefficient which is the fourth heat transfer coefficient of the bent portion and is smaller than the fifth heat transfer coefficient are stored.

With respect to the second heat transfer coefficients (hc1, hc2, hc3 and the like), the plates are stacked also in a Z axis direction at the bent portion and hence, the closer to the bent portion from the flat portion, the smaller value the heat transfer coefficient takes. That is, the heat transfer coefficient hc2 in a range which strides over the flat portion and the bent portion takes a smaller value compared to the heat transfer coefficient hc1 at the flat portion, and the heat transfer coefficient hc3 at the bent portion takes a smaller value compared to the heat transfer coefficient hc2.

That is, with respect to both the first heat transfer coefficient and the second heat transfer coefficient, the closer to the bent portion from the flat portion of the electrode assembly, the smaller value the heat transfer coefficient takes, and these heat transfer coefficients are set and stored in a memory 130 in advance.

As has been described above, in the energy storage device state estimation device 100 according to this modification, the third heat transfer coefficient which is the first heat transfer coefficient in the inside of the same electrode assembly and the fourth heat transfer coefficient which is the first heat transfer coefficient between the different electrode assemblies and takes a smaller value compared to the third heat transfer coefficient are stored in the memory. That is, an electrode assembly is configured in general such that an outermost periphery of the electrode assembly is covered by a separator, an insulation sheet or the like in a state where a positive electrode plate and a negative electrode plate are not interposed and hence, a heat transfer coefficient between the electrode assemblies becomes smaller than a heat transfer coefficient in the inside of the electrode assembly. Accordingly, in the energy storage device state estimation device 100, the heat transfer coefficients can be stored in the memory accurately and hence, a state of the energy storage device 200 can be estimated by estimating a temperature of the energy storage device 200 with higher accuracy.

Further, in the energy storage device state estimation device 100, the fifth heat transfer coefficient which is the fourth heat transfer coefficient in the flat portion of the winding type electrode assembly and the sixth heat transfer coefficient which is the fourth heat transfer coefficient in the bent portion of the electrode assembly and is smaller than the fifth heat transfer coefficient are stored in the memory. That is, in the case where a plurality of winding type electrode assemblies are arranged side by side, a distance between the bent portions of the electrode assemblies disposed adjacently each other becomes larger than a distance between the flat portions of the electrode assemblies disposed adjacently to each other and hence, the heat transfer coefficient between the bent portions of the electrode assemblies disposed adjacently to each other becomes smaller than the heat transfer coefficient between the flat portions of the electrode assemblies disposed adjacently to each other. Accordingly, in the energy storage device state estimation device 100, the accurate heat transfer coefficients can be stored in the memory and hence, a state of the energy storage device 200 can be estimated by estimating a temperature of the energy storage device 200 with higher accuracy.

The energy storage device 200 may be more finely divided into a large number of regions, and the energy storage device 200 may store heat transfer coefficients corresponding to the large number of finely divided regions in "heat transfer coefficient" of estimation data 132 of the memory 130. By finely dividing the energy storage device 200 into the regions, a temperature of the energy storage device 200 can be estimated with higher accuracy.

(Modification 2)

Next, the modification 2 of the above-mentioned embodiment is described. In the above-mentioned embodiment, the case is described where the energy storage device state estimation device 100 is provided to the energy storage system 10 (energy storage module) shown in FIG. 1. However, in this modification, the energy storage device state estimation device 100 is provided to an energy storage system in a mode different from the energy storage system 10 shown in FIG. 1.

Figure 15:
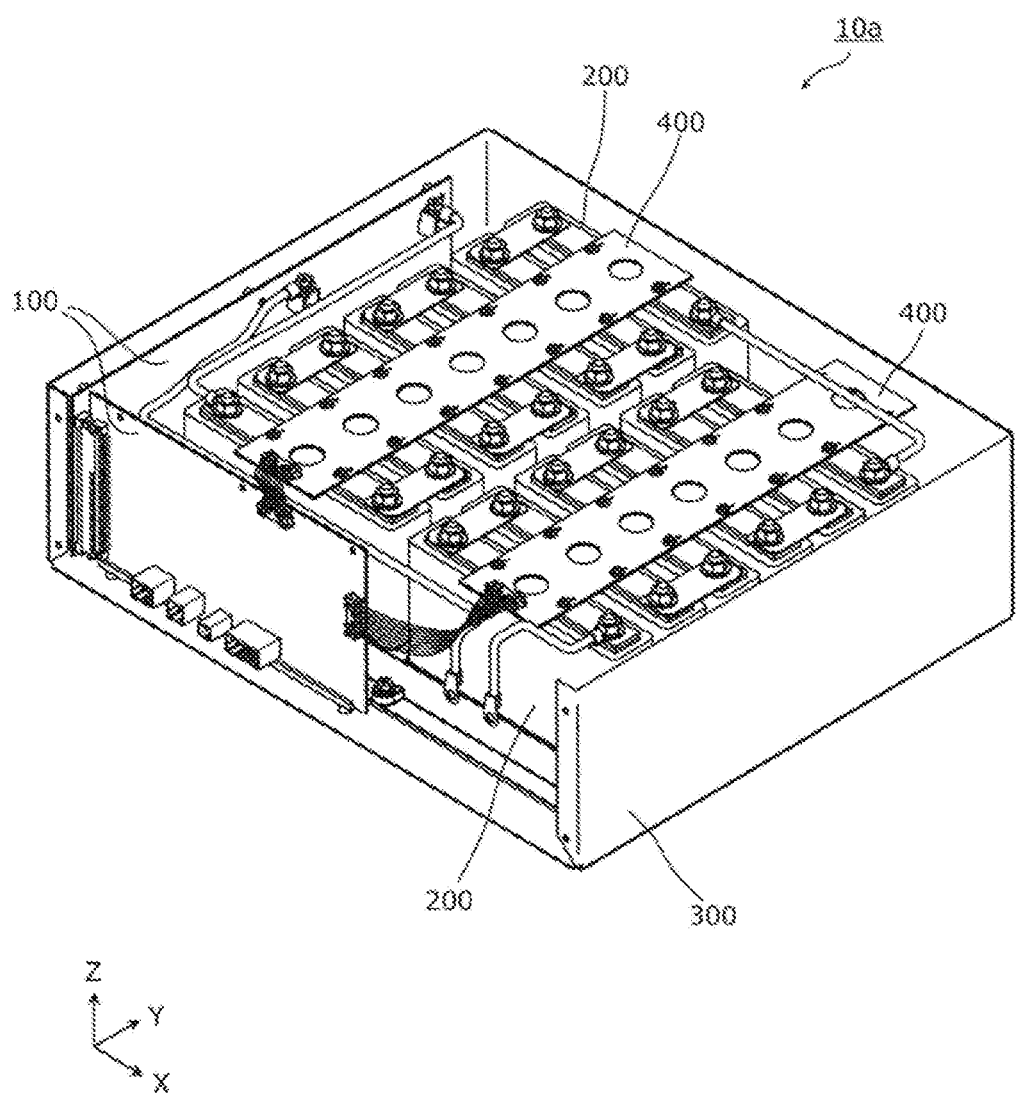
FIG. 15 is an external appearance view of an energy storage system which includes an energy storage device state estimation device according to a modification 2.
Figure 16:
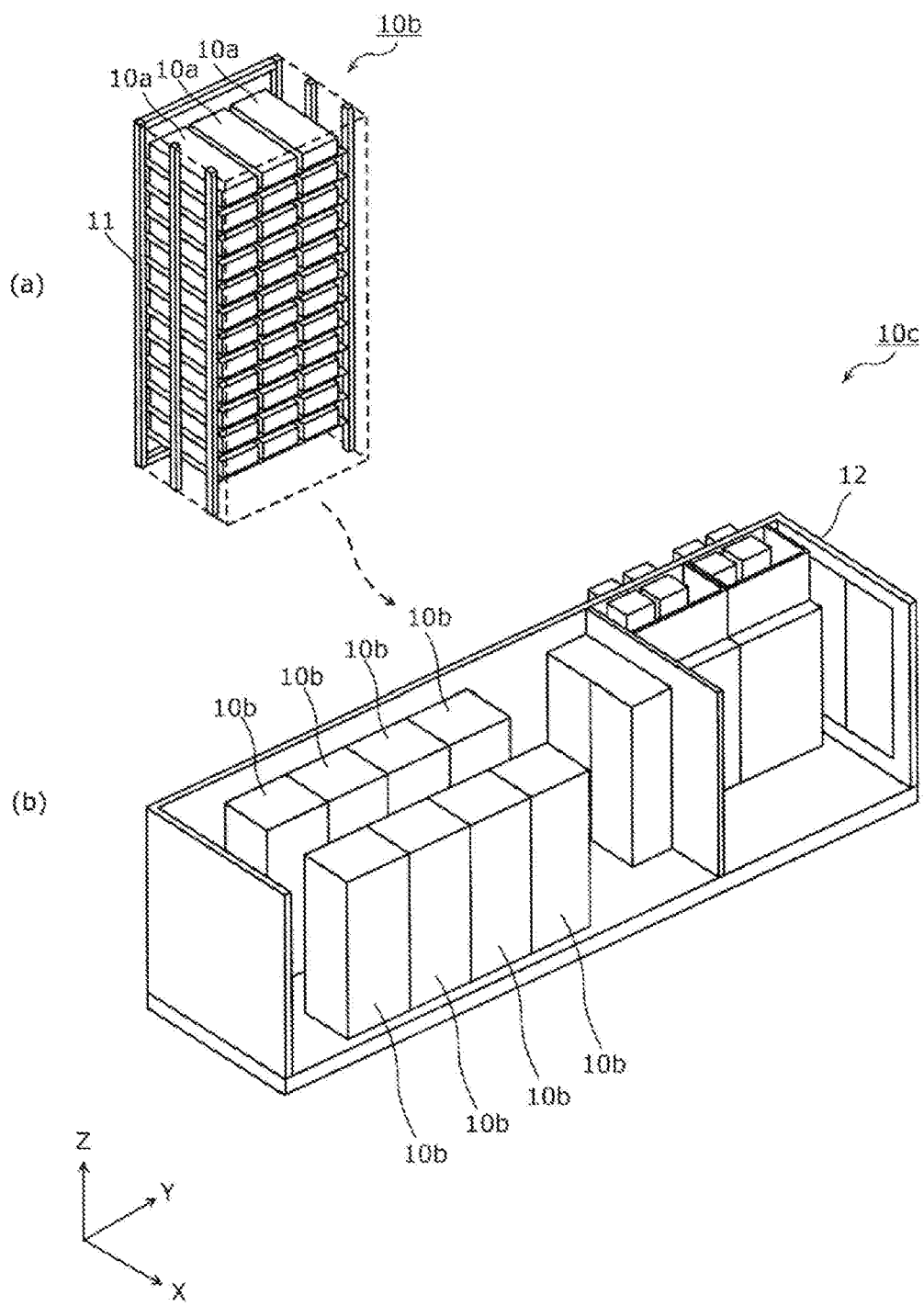
FIG. 16 is an external appearance view of an energy storage system which includes an energy storage device state estimation device according to another mode of the modification 2.

FIG. 15 and FIG. 16 are an external appearance view of an energy storage system which includes an energy storage device state estimation device 100 according to this modification. To be more specific, FIG. 15 shows an energy storage module 10a which forms the energy storage system provided with the energy storage device state estimation device 100. (a) of FIG. 16 shows an energy storage apparatus 10b which forms an energy storage system provided with an energy storage device state estimation device 100. (b) of FIG. 16 shows an energy storage facility 10c which forms an energy storage system provided with an energy storage device state estimation device 100.

Firstly, as shown in FIG. 15, the energy storage module 10a which forms the energy storage system is an energy storage module used as an installed type power source device, for example. The energy storage module 10a includes the energy storage device state estimation device 100 between the energy storage device 200 and a side wall of an accommodating case 300. That is, the energy storage device state estimation device 100 is an L-shaped printed circuit board disposed on an inner side of the side wall of the accommodating case 300 in a fixed manner. The energy storage device state estimation device 100 is connected to the plurality of energy storage devices 200 via a printed circuit board 400 and wiring disposed on the plurality of the energy storage devices 200. In FIG. 15, the accommodating case 300 is illustrated in the form that a part of the side wall and an upper wall of the accommodating case 300 are omitted.

Further, as shown in (a) of FIG. 16, an energy storage apparatus 10b which forms an energy storage system includes, for example, a plurality of energy storage modules 10a shown in FIG. 15, and the plurality of energy storage modules 10a are disposed and supported on a rack 11. That is, the energy storage apparatus 10b includes a plurality of energy storage modules 10a to each of which the energy storage device state estimation device 100 is provided. The energy storage apparatus 10b may include a plurality of the energy storage systems 10 (energy storage modules) shown in FIG. 1.

Further, as shown in (b) of FIG. 16, the energy storage facility 10c which forms the energy storage system includes, for example, a plurality of energy storage apparatuses 10b, and the plurality of energy storage apparatuses 10b are disposed in a case 12. That is, the energy storage facility 10c includes the plurality of energy storage apparatuses 10b each having the energy storage module 10a to which the energy storage device state estimation device 100 is provided. In this modification 2, for example, the case 12 is a case having a space into which a person can enter. That is, the case 12 is a metal-made hollow and rectangular parallelepiped box body having a size which allows the entrance of a person into the inside of the case 12 at the time of maintenance of internal equipment. The case 12 is installed on a ground in a self-standing manner. The case 12 is a concept which includes a so-called shelter-like box body or a box body or the like which is transportable by a transport means such as a truck or a train. In (b) in FIG. 16, a portion of the side wall and an upper wall of the case 12 are not shown in the drawing.

The energy storage system to which the energy storage device state estimation device 100 is provided as described in the modifications is not particularly limited. That is, the energy storage device state estimation device 100 may be provided to an energy storage system having any configuration, and the energy storage device state estimation device 100 can estimate a state of the energy storage device 200 which one of energy storage systems having various configurations has with the simple constitution.

The energy storage device state estimation device 100 and the energy storage system according to the embodiment and the modifications of the embodiment of the present invention have been described heretofore. However, the present invention is not limited to such an embodiment and modifications. That is, the embodiment and the modifications of the embodiment which are disclosed this time are provided only for an illustrative purpose in all aspects, and it should not be construed that the present invention is limited to the embodiment and the modifications of the embodiment. The scope of the present invention is not defined by the above-mentioned description but by the scope of claims, and intends to include all alterations which are considered equivalent to the scope of claims and fall within the scope of claims.

For example, in the above-mentioned embodiment and modifications of the embodiment, the energy storage device 200 includes so-called two vertical winding type electrode assemblies 261, 262 respectively having a winding axis in an X axis direction. However, the energy storage device 200 may include, for example, so-called two lateral winding type electrode assemblies respectively having a winding axis in a Z axis direction, a stacked type electrode assembly where planar plates are stacked and an electrode assembly where plates are folded in a zigzag manner. The number of electrode assemblies is not limited to two, and may be one or three or more. In this case, in "heat transfer coefficient" of estimation data 132 of the memory 130, heat transfer coefficients corresponding to the shape of the electrode assembly or the number of the electrode assemblies are stored.

In the above-mentioned embodiment and the modifications of the embodiment, the case is considered where the energy storage device 200 has a rectangular box-like (angular) shape. However, the shape of the energy storage device 200 may be a circular columnar shape, an elongated circular columnar shape or the like. The energy storage device may be a laminate type energy storage device. In this case, heat transfer coefficients corresponding to the shape of the energy storage device 200 may be stored in "heat transfer coefficient" of the estimation data 132 of the memory 130.

In the above-mentioned embodiment and the modifications of the embodiment, the case is considered where the heat transfer amount acquisition part 112 acquires a temperature of the space where the energy storage device 200 is disposed as a temperature of the external region. However, the temperature of the external region is not limited to one common temperature. That is, the temperature of the external region may be made different corresponding to the position of the internal region. For example, the temperature of the external region disposed adjacently to the side wall 212 shown in FIG. 7 and the temperature of the external region disposed adjacently to the side wall 214 shown in FIG. 7 may be stored in charge-discharge history data 131 as different temperatures.

In the above-mentioned embodiment and the modifications of the embodiment, as shown in FIG. 6, FIG. 7 and FIG. 14, the case is considered where the internal regions are set by dividing the energy storage device 200. Any desired manner of dividing the energy storage device 200 and any desired manner of setting the internal regions may be adopted such as cutting the energy storage device 200 in an oblique direction or forming one integral region by joining a plurality of regions.

In the above-mentioned embodiment and the modifications of the embodiment, the case is considered where the energy storage device which becomes an object for estimation of a state (or a temperature) is one energy storage device 200 (single cell). However, a size of the energy storage device (size of the internal region) which becomes an object for estimation of a state (or a temperature) is not particularly limited. For example, an energy storage module (battery pack) which is formed by combining a plurality of energy storage device 200 (single cells) may be the energy storage device which becomes an object for estimation of a state (or a temperature). In this case, one single cell may be divided into a small number of internal regions or one single cell per se may be considered as one internal region. By increasing an area of the finely divided internal region, an arithmetic operation speed (estimation calculation speed) can be increased. Further, an energy storage pack (battery pack) which includes a plurality of the above-mentioned energy storage modules or an energy storage system which includes a plurality of energy storage packs may be adopted as the energy storage device which becomes an object for estimation of a state (or a temperature). In this case, a balance between and an arithmetic operation speed and estimation accuracy may be taken by suitably changing the finely divided internal regions (for example, forming one internal region using a plurality of single cells or the like) corresponding to the numbers (size) of the singles cells to be mounted.

In the above-mentioned embodiment and the modifications of the embodiment, the energy storage device state estimation device 100 includes the memory 130, and charge-discharge history of the energy storage device 200 and information for estimating a state of the energy storage device 200 are stored in the memory 130. However, the energy storage device state estimation device 100 may not include the memory 130, and may use an external memory in place of the memory 130.

The energy storage device state estimation device 100 may have a function of estimating a safety state such as generating an alarm for securing safety by detecting abnormality of the energy storage device 200 by referencing data relating to an estimated state of the energy storage device 200.

Figure 17:
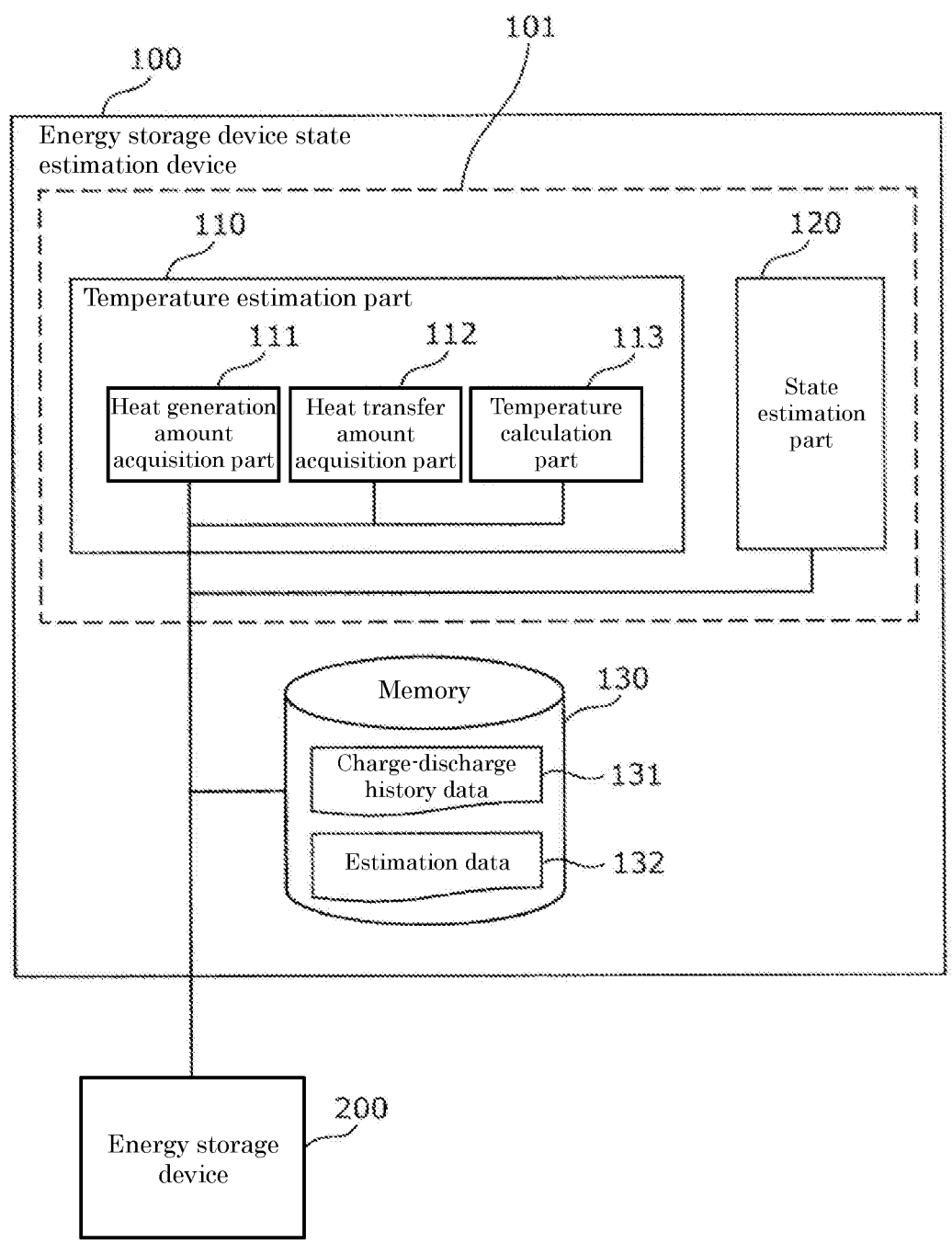
FIG. 17 is block diagram showing the configuration where an energy storage device state estimation device according to the embodiment is realized by an integrated circuit.

The processing part which the energy storage device state estimation device 100 according to the present invention includes is typically realized in the form of a LSI (large scale integration) which is an integrated circuit. That is, as shown in FIG. 17, for example, the present invention is realized as an integrated circuit 101 which includes a temperature estimation part 110 and a state estimation part 120. FIG. 17 is a block diagram showing the configuration where the energy storage device state estimation device 100 according to the embodiment of the present invention is realized by an integrated circuit.

The respective processing parts which the integrated circuit 101 includes may be individually formed of one chip or may be formed of one chip such that the chip includes some or all processing parts. In the above-mentioned embodiment and the modifications of the embodiment, an LSI is used as the integrated circuit. However, the integrated circuit may be referred to as an IC, a system LSI, a super LSI, an ultra LSI depending on the degree of integration. Further, a technique of forming an integrated circuit is not limited to an LSI and may be realized using a dedicated circuit or a general-purpose-use processor. After manufacturing an LSI, a programmable FPGA (Field Programmable Gate Array) or a reconfigurable processor where the connection and setting of circuit cells in a LSI are reconfigurable can be also used. Further, a technique for forming an integrated circuit which replaces an LSI is newly developed along with the progress of a semiconductor technology or other technologies derived from the semiconductor technology, the integration of functional blocks may be performed using such technologies as a matter of course. The application of biotechnology is also considered as a possibility The present invention can be realized not only in the form of the energy storage device state estimation device 100 but also in the form of an energy storage device state estimation method which uses characteristic processing which the energy storage device state estimation device 100 performs as a step.

Further, the present invention can be realized in the form of a program which allows a computer (processor) to execute characteristic processing contained in an energy storage device state estimation method or in the form of a non-volatile storage medium in which the program which is readable by a computer (processor) is stored, for example, any medium such as a flexible disc, a hard disc, a CD-ROM, an MO, a DVD, a DVD-ROM, a DVD-RAM, a BD (Blu-ray(registered trademark) Disc), a semiconductor memory, a flash memory, a magnetic storage device, an optical disc or a paper tape. Such a program can be circulated through a transmission medium such as a storage medium such as a CD-ROM and the Internet.

The configurations obtained by arbitrarily combining the above-mentioned embodiment and modifications of the embodiment also fall within the scope of the present invention.

INDUSTRIAL APPLICABILITY

The present invention is applicable to an energy storage device state estimation device which can estimate a state of an energy storage device with a simple constitution or the like.

DESCRIPTION OF REFERENCE SIGNS

10: energy storage system
10a: energy storage module (energy storage system)
10b: energy storage apparatus (energy storage system)
10c: energy storage facility (energy storage system)
11: rack
12: case
100: energy storage device state estimation device
101: integrated circuit
110: temperature estimation part
111: heat generation amount acquisition part
112: heat transfer amount acquisition part
113: temperature calculation part
120: state estimation part
130: memory
131: charge-discharge history data
132: estimation data
200: energy storage device
210: case
211 to 214: side wall
215: bottom wall
216: lid body
220: positive electrode terminal
230: negative electrode terminal 240: positive electrode current collector
250: negative electrode current collector
261, 262: electrode assembly
261a, 261b, 262a, 262b: flat portion
261c, 261d, 262c, 262d: bent portion
300: accommodating case
400: printed circuit board

The invention claimed is:

1. An energy storage device state estimation device for estimating a state of an energy storage device, the energy storage device state estimation device comprising an integrated circuit comprising:
   a temperature estimation part configured to estimate a temperature of the energy storage device; and
   a state estimation part configured to estimate a state of the energy storage device using the temperature of the energy storage device,
   wherein
   the temperature estimation part is configured to estimate the temperature of the energy storage device using each internal heat transfer amount which is a transfer amount of heat between two internal regions disposed adjacently to each other and each external heat transfer amount which is a transfer amount of heat between each internal region and an external region disposed adjacently to each other, each of the internal regions being set by dividing an internal region of the energy storage device, the external region being a region outside the energy storage device adjacently disposed to the internal regions.

2. The energy storage device state estimation device according to claim 1, further comprising a memory configured to store a heat transfer coefficient between the two internal regions disposed adjacently to each other, and a heat transfer coefficient between the internal region and the external region disposed adjacently to each other,
   wherein the temperature estimation part is configured to calculate the internal heat transfer amount and the external heat transfer amount using the heat transfer coefficients stored in the memory.

3. The energy storage device state estimation device according to claim 2, wherein
   the energy storage device has an electrode assembly formed by stacking plates, and
   in the memory, a first heat transfer coefficient which is a heat transfer coefficient between the two internal regions arranged in a stacking direction of the plates, and a second heat transfer coefficient which is a heat transfer coefficient between the two internal regions disposed in a direction which intersects with the stacking direction and is larger than the first heat transfer coefficient are stored.

4. The energy storage device state estimation device according to claim 3, wherein
   the energy storage device includes a plurality of the electrode assemblies, and
   in the memory, a third heat transfer coefficient, which is the first heat transfer coefficient in an inside of one of the electrode assemblies, and a fourth heat transfer coefficient, which is the first heat transfer coefficient between one of the electrode assemblies and another one of the electrode assemblies and is smaller than the third heat transfer coefficient, are stored.

5. The energy storage device state estimation device according to claim 4, wherein
   each of the plurality of electrode assemblies has flat portions and bent portions formed by winding the plates, and
   in the memory, a fifth heat transfer coefficient, which is the fourth heat transfer coefficient between one of the flat portions in one of the electrode assemblies and one of the flat portions in another one of the electrode assemblies, and a sixth heat transfer coefficient, which is the fourth heat transfer coefficient between one of the bent portions in one of the electrode assemblies and one of the bent portions in another one of the electrode assemblies and is smaller than the fifth heat transfer coefficient, are stored.

6. The energy storage device state estimation device according to claim 1, wherein the temperature estimation part calculates the internal heat transfer amount and the external heat transfer amount from a first point of time to a second point of time using a temperature of the internal region and a temperature of the external region at the first point of time, calculates a temperature of the internal region at the second point of time using the calculated inner heat transfer amount and the external heat transfer amount, and estimates a temperature of the energy storage device using the calculated temperature of the internal region.

7. The energy storage device state estimation device according to claim 6, wherein the temperature estimation part acquires a temperature in a space where the energy storage device is disposed as a temperature of the external region.

8. The energy storage device state estimation device according to claim 1, wherein with respect to a temperature of the internal region acquired using the internal heat transfer amount and the external heat transfer amount, the temperature estimation part calculates a temperature of the internal region at a center position of the energy storage device or an average value of temperatures of the respective internal regions as a temperature of the energy storage device.

9. An energy storage device state estimation device for estimating a state of an energy storage device, the energy storage device state estimation device comprising an integrated circuit comprising:
   a temperature estimation part configured to estimate a temperature of the energy storage device; and
   a state estimation part configured to estimate a state of the energy storage device using the temperature of the energy storage device,
   wherein
   the temperature estimation part estimates a temperature of the energy storage device using a heat generation amount and a heat absorption or generation amount, the heat generation amount being calculated based on a current value and a difference between a measured voltage and an open circuit voltage of the energy storage device within a predetermined period, the heat absorption or generation amount being acquired based on a change in an SOC (State Of Charge) within the predetermined period.

10. An energy storage system comprising:
    an energy storage device; and
    the energy storage device state estimation device described in claim 1 which is configured to estimate a state of the energy storage device.

11. An energy storage device state estimation method for estimating a state of an energy storage device, the method comprising:

a temperature estimation step of estimating a temperature of the energy storage device; and a state estimation step of estimating a state of the energy storage device using the temperature of the energy storage device, wherein the temperature estimation step comprises estimating the temperature of the energy storage device using each internal heat transfer amount which is a heat transfer amount between two of internal regions disposed adjacently to each other and each external heat transfer amount which is a heat transfer amount between each internal region and an external region disposed adjacently to each other, each of the internal regions being set by dividing an internal region of the energy storage device, the external region being a region outside the energy storage device adjacently disposed to the internal regions.

12. An energy storage device state estimation method for estimating a state of an energy storage device, the method comprising:

a temperature estimation step of estimating a temperature of the energy storage device; and a state estimation step of estimating a state of the energy storage device using the temperature of the energy storage device, wherein in the temperature estimation step, a temperature of the energy storage device is estimated using a heat generation amount and a heat absorption or generation amount, the heat generation amount being calculated based on a current value and a difference between a measured voltage and an open circuit voltage of the energy storage device within a predetermined period, the heat absorption or generation amount being acquired based on a change in an SOC (State Of Charge) within the predetermined period.

13. A non-volatile computer readable storage medium storing a program configured to allow a processor to execute a step included in the energy storage device state estimation method described in claim 11.

14. The energy storage device state estimation device according to claim 1, wherein the temperature estimation part estimates the temperature of the energy storage device by calculation without measuring a temperature of the energy storage device.

15. The energy storage device state estimation device according to claim 1, wherein the temperature estimation part acquires each heat transfer coefficient set for the two internal regions disposed adjacently to each other, and acquires each heat transfer coefficient set for each internal region and the external region disposed adjacently to each other, and the temperature estimation part estimates the temperature of the energy storage device using each internal heat transfer amount and each external heat transfer amount obtained from the acquired heat transfer coefficients.

* * * * *